(12) United States Patent
Allcorn et al.

(10) Patent No.: US 9,981,731 B2
(45) Date of Patent: May 29, 2018

(54) AMR SYSTEM WITH FLY-BY MODE

(71) Applicants: Roger Allcorn, Arab, AL (US); Floyd Stanley Salser, Ocala, FL (US); William Monty Simmons, Lenoir, NC (US)

(72) Inventors: Roger Allcorn, Arab, AL (US); Floyd Stanley Salser, Ocala, FL (US); William Monty Simmons, Lenoir, NC (US)

(*) Notice: Subject to any disclaimer, the term of this patent is extended or adjusted under 35 U.S.C. 154(b) by 66 days.

(21) Appl. No.: 15/202,561

(22) Filed: Jul. 5, 2016

(65) Prior Publication Data

US 2017/0003142 A1 Jan. 5, 2017

Related U.S. Application Data

(63) Continuation-in-part of application No. 14/108,314, filed on Dec. 16, 2013, now Pat. No. 9,400,192.

(Continued)

(51) Int. Cl.
| | |
|---|---|
| *G08B 23/00* | (2006.01) |
| *B64B 1/06* | (2006.01) |
| *H04W 52/28* | (2009.01) |
| *B64C 39/02* | (2006.01) |
| *G01D 4/00* | (2006.01) |
| *G01F 15/06* | (2006.01) |
| *H01Q 1/22* | (2006.01) |
| *E02D 29/12* | (2006.01) |

(Continued)

(52) U.S. Cl.
CPC .............. *B64B 1/06* (2013.01); *B64C 39/024* (2013.01); *E02D 29/12* (2013.01); *G01D 4/002* (2013.01); *G01F 15/063* (2013.01); *H01Q 1/2233* (2013.01); *H04W 52/283* (2013.01); *B64C 2201/122* (2013.01); *G01F 15/18* (2013.01); *G01R 22/063* (2013.01); *G01R 22/065* (2013.01); *Y02B 90/241* (2013.01); *Y02B 90/248* (2013.01); *Y04S 20/32* (2013.01); *Y04S 20/52* (2013.01)

(58) Field of Classification Search
CPC ....................................................... B64B 1/06
See application file for complete search history.

(56) References Cited

U.S. PATENT DOCUMENTS

| | | | | |
|---|---|---|---|---|
| 5,461,558 A | * | 10/1995 | Patsiokas | H02J 9/005 340/309.4 |
| 5,481,259 A | * | 1/1996 | Bane | G08C 17/02 340/505 |

(Continued)

*Primary Examiner* — Stephen W Jackson
(74) *Attorney, Agent, or Firm* — Monty Simmons; Simmons Patents

(57) ABSTRACT

The disclosed inventions include and apparatus and method for providing a universal Automatic Meter Reading (AMR) system configured with fly-by functionality. Such system may be configured to work in a plurality of modes including a walk-bay, drive-by, fixed network, and fly-by mode without hardware modifications. The system is configured to automatically calibrate so that the water meter transmitter operates at a minimum transmitted signal power level. Additional features include automatic hardware self-healing features where the system continues to function after certain hardware failures occur.

20 Claims, 17 Drawing Sheets

Related U.S. Application Data which is a continuation-in-part of application No. 13/555,065, filed on Jul. 20, 2012, now Pat. No. 8,610,594, which is a continuation-in-part of application No. 13/159,360, filed on Jun. 13, 2011, now Pat. No. 8,657,021, which is a continuation-in-part of application No. 12/143,822, filed on Jun. 23, 2008, now Pat. No. 7,994,935, which is a continuation-in-part of application No. 12/050,160, filed on Mar. 17, 2008, now Pat. No. 7,980,317, which is a continuation-in-part of application No. 10/989,811, filed on Nov. 16, 2004, now Pat. No. 7,498,953, and a continuation-in-part of application No. 13/555,065, filed on Jul. 20, 2012, now Pat. No. 8,610,594, and a continuation-in-part of application No. 13/159,360, filed on Jun. 13, 2011, now Pat. No. 8,657,021, and a continuation-in-part of application No. 12/143,822, filed on Jun. 23, 2008, now Pat. No. 7,994,935, and a continuation-in-part of application No. 10/989,811, filed on Nov. 16, 2004, now Pat. No. 7,498,953, and a continuation-in-part of application No. 15/179,716, filed on Jun. 10, 2016.

(60) Provisional application No. 62/188,616, filed on Jul. 3, 2015.

(51) Int. Cl.
  *G01R 22/06* (2006.01)
  *G01F 15/18* (2006.01)

(56) References Cited

U.S. PATENT DOCUMENTS

| | | | |
|---|---|---|---|
| 7,274,305 B1 * | 9/2007 | Luttrell | B61L 1/20 324/141 |
| 7,298,288 B2 * | 11/2007 | Nagy | G01D 4/002 340/870.02 |
| 7,417,557 B2 * | 8/2008 | Osterloh | G01D 4/004 340/870.02 |
| 7,980,317 B1 * | 7/2011 | Preta | E03B 9/02 169/60 |
| 7,994,935 B2 * | 8/2011 | Salser, Jr. | H04Q 9/00 340/870.02 |
| 8,610,594 B1 * | 12/2013 | Salser, Jr. | G01D 4/002 340/870.02 |
| 9,752,895 B2 * | 9/2017 | Winter | G01D 4/004 |

* cited by examiner

US 9,981,731 B2

AMR SYSTEM WITH FLY-BY MODE

CLAIM TO PRIORITY

This application is a continuation of Ser. No. 15/179,716, filed 10 Jun. 2016 (now U.S. Pat. No. 9,891,089, which claims priority to provisional application 62/188,616 filed on 3 Jul. 2015, and is a continuation application Ser. No. 14/108,314, filed 16 Dec. 2013 (now U.S. Pat. No. 9,400,192) is a continuation of application Ser. No. 13/555,065 filed on 20 Jul. 2012 (now U.S. Pat. No. 8,610,594) which is a continuation of Ser. No. 13/159,360 filed on 13 Jun. 2011 (now U.S. Pat. No. 8,657,021) which is a continuation of Ser. No. 12/143,822 filed on 23 Jun. 2008 (now U.S. Pat. No. 7,994,935) which is a continuation of Ser. No. 12/050,160 filed on 17 Mar. 2008, (now U.S. Pat. No. 7,980,317) which is a continuation of application Ser. No. 10/989,811 filed on 16 Nov. 2004 (now U.S. Pat. No. 7,498,953), the entire contents of all such references are incorporated herein by this reference for all that they disclose.

TECHNICAL FIELD OF THE INVENTION

The present invention relates to an apparatus and method for transmitting data from a first location to a second location. The technology is particularly well suited for transferring data associated with a utility meter to a remote location. The apparatus comprises a universal transmitter configured to operate in a plurality of modes including walk-by, drive-by, fixed network and a fly-by mode without the need for hardware modification. One configuration uses Drone technology.

BACKGROUND

Utility meters, including mechanical, electromechanical, and solid-state meters, are well known and have been used for many years to measure the consumption of resources such as water, gas and electricity. Water meters, for example, generate data indicative of the consumption of water, where such data is used for billing purposes. Initially, utility meters were mechanical devices. As electronic technology advanced, such technology become more common in utility meters to make them smaller, more accurate, more dependable, smarter and less expensive. The electronics are typically used in a part of the meter called the "register" (as it "registers" the amount of consumption). As such, the use of electromechanical (hybrid meters) and electronic meters has become more common. Indeed, most modern electricity meters, for example, are fully electronic meters (static meters).

Traditionally, meter reading personnel would periodically travel to each site where a utility meter was installed, inspect a meter installation and manually record the consumption data. The customer would then receive a bill based on such collected data. Today, modern meters are increasingly equipped with transmitters giving such meters Automatic Meter Reading (AMR) capabilities. Such technology allows utility meters to automatically communicate consumption data to a remote receiver and the remote receiver transfers the data to a "system owner" (e.g. Utility Provider). Such transmitters are either electrically associated with the meter's register or designed into (integral to) the meter's register.

Notably, for at least safety reasons, water meters (and their associated electronic features) do not have access to a power grid (such as a typical residential power grid that powers homes) requiring such meters to be powered by power sources that can be depleted over time (e.g. a battery). Therefore, the meter and associated AMR technology is designed for minimal power consumption so that such technology may be powered for extended periods of time (e.g. 10 years) by power sources such as batteries.

Another challenge to the manufacturers of utility meters and ARM systems, in general, is that the utility meter market is very cost sensitive. A water utility, for example, may need to purchase 100,000 fluid meters (with associated AMR features) and the savings accumulate quickly as costs are reduced. A one-dollar cost reduction for an AMR transmitter quickly becomes a $100,000 savings. Further, dependability is a critical factor. Thus, for water meters, an AMR system is expected to operate adequately for at least 10 years at the lowest possible design costs while being powered by a battery.

Initially, water utilities had meter readers drive out to each water meter, read the meter, and manually record the consumption data. A very large and expensive task for a utility with 100,000 meters and there is likely to be errors in the manually recorded data for 100,000 meters.

The first AMR systems simplified such task by associating a short-range transmitter with the meter register and giving the meter reader a receiver he/she carried so that the meter reader would simply walk by the utility meter and the data would be automatically transmitted to the receiver associated with the meter reader. Nice improvement but such still required the meter reader to walk close by each meter. As transmitter technology improved, drive-by systems were developed where the receiver was associated with a vehicle and the meter reader simply drove down the street. Such systems are still in wide use today.

One "weakness" of walk-by and drive-by systems is that real time data or near real time data is not possible. One cannot typically access consumption data any time desired. However, consumers and utilities wanted such capability. Thus, fixed-network systems were developed. In a fixed-network system "remote receives" (perhaps called "Collectors") are placed at various locations throughout the utility's customer areas. Such collectors had access to adequate power so that they could stay on all the time. Further, such collectors had a communication path to the utility. Additionally, the water meter transmitter would include a receiver and listen for a request for data. Thus, a particular water meter transmitter could be accessed whenever the utility desired.

There is always a price to pay for improved performance and the price for real time data is money. The system cost more, the meter transmitter cost more, the system is more complex, and thus, more prone to failures. That said, it should be appreciated that all of the above described AMR systems have their trade-offs between equipment costs, battery cost, battery life, transmission frequency (how often they transmit) and transmission distance and whether or not they can provide real or near real time data.

Notably, not all utility providers have the same amount of funds to purchase metering technology. Some utilities are required to purchase lower cost walk-by and drive-by systems until they can afford to migrate to a fixed network system. Some utilities may have large and very diverse coverage areas requiring fixed network in one area, drive-by technology in another area and walk-by technology in yet another area. Unfortunately, there was a problem with prior art systems in that prior art drive-by/walk-by and Fixed network AMR systems were not compatible with each other. Restated, prior art drive-by/walk-by transmitters were not configured to operate in fixed network systems and vice-versa. For example, a typical drive-by/walk-by system transmitter may transmit a 0.08 Watt data (a "whisper") signal while a typical fixed network transmitter may operate at up to 1.0 watts (a "shout"). Additionally, it should be appreciated that for a two-way communication system the water meter transmitter has a receiver AND a transmitter—sometimes called a "transceiver". Further, if a first transceiver (T1) transmits an "X-watt" signal to a second transceiver (T2), transceiver T2 should transmit an X-watt response signal. To use an analogy, if person A whispers to person B, person B should whisper back to person A, not shout back. If you whisper to someone that had to shout to you that someone is unlikely to hear you. Same for radio signals.

Such incapability between walk-by/drive-by/fixed network systems presented a huge problem to water utilities. The technology that provides the above described advantages is not free and utilities must be careful to select the best AMR system for their needs. Additionally, while a fixed network system may clearly the best technical solution for a particular area, a utility may not have the funds to install a fixed network solution. Thus, such a utility may simply purchase a system it can afford such as a less expensive walk-by/drive-by system. When the above described utility decides to upgrade to a fixed network solution as funds become available, it must replace the drive-by transmitters with RF systems suitable for a fixed network. To do so perfectly good transmitters were scrapped for updated transmitters. Such an upgrade process is clearly a waste of resources as perfectly good meter transmitters are scrapped.

Back at least as early as 2004 MARS® Water was the first company to develop and patent the "universal transmitter" particularly useful for water meters. Such Universal Meter Transmitter (UMT) is disclosed in commonly owned U.S. Pat. No. 7,498,953, filed 16 Nov. 2004, U.S. Pat. No. 7,994,935, U.S. Pat. No. 8,610,594, and recently allowed patent application Ser. No. 14/108,314, the contents of which are incorporated herein by this reference for all that they disclose for all purposes. Such a universal meter transmitter (UMT) is configured to be associated with a water meter and is configurable to operate in any one of a plurality of modes (such as a walk-by, drive-by and a Fixed Network mode) without hardware modification with some embodiments including auto-calibration routines to configure the AMR network. With such an UMT device, a water utility may first implement a walk-by/drive-by AMR system and then migrate/upgrade to a fixed network solution at minimal costs as the transmitter can be used in the new system.

MARS'® innovation efforts continue as the disclosed technology relates to an improved AMR system comprising UMT transmitters that combine the best features from walk-by systems and fixed network systems as described below.

One point to consider about all the various AMR systems identified above is that for all such systems there are typically many, many more Meter Transmitters than Remote Receivers (perhaps 50,000 meter transmitters to 1 remote receiver). Restated, every utility meter does not have its own dedicated meter reader. Indeed, there may only be one meter reader for 50,000 meters. Thus, the most cost effective and competitive system is one that transfers costs from the meter transmitter to the Remote Receiver (meter reader).

Embodiments of the disclosed technology leverage the concept of transferring costs from the meter transmitter to the remote receiver. For some UMTS, the most expensive component is the battery. Reducing battery costs for the UMT is a huge advantage. The most power hungry activity of a typical AMR system is transmitting a data signal to a remote location. Thus, the lower the power level needed to transmit a signal the longer a particular battery style will last. Alternatively, instead of extending battery life a lower cost battery may be used (or a combination of both).

To better appreciate transmitter power levels and how the environment affects the transmitted data signal from an UMT to a Remote Receiver a review of the environmental factors that attenuate Radio Frequency (RF) signals along its propagation path is useful. The environmental issues with RF propagation include:

(a) Scattering: Signal scattering can be caused by a random arrangement of signal wavelength sized (or smaller) objects (about 12-13 inches for the typical AMR frequency). Rain is a good example. An analogy would be shining a light through fog as opposed to clear air.

(b) Absorption/Reflection: When RF energy passes through a non-RF transparent structure some of its energy is absorbed and/or reflected. Luckily the frequency of the transmitted signal does not change but amplitude is attenuated when absorbed and at least redirected when reflected. An "RF Transparent" structure is simply an object that has no significant reflection or absorption of RF signals (similar to the way glass is light transparent).

(c) Diffraction: Diffraction is simply a special type of "reflection" caused by abrupt changes and sharp non-RF transparent surface "edges" which causes signal distortion.

(e) Distance: Even in perfect "free space" line-of-site conditions with no obstructions, as radio waves travel the signal (and associated energy) is distributed/divided over an increasingly wider area, and thus, becomes weaker (like putting a drop of food coloring in water—as it disperses over a wider area the color gets "weaker"). Consequently, the amount of detectable radiation varies inversely as the square of the distance from an emitting object. Simply put, as radiation (e.g. radio waves) moves away from its source it is steadily diluted as it spreads over a progressively larger surface area.

Based on the above, the RF environmental propagation parameters that need to be considered include scattering, absorption/reflection, diffraction, and distance. Notably, for a fixed (non-moving) Universal Meter Transmitter (UMT), substantially all such propagation parameters are basically a function of remote receiver antenna height and distance relative to the UMT. The goal is to achieve the best propagation path between UMT and remote receiver. The best propagation path between the UMT and a remote receiver is a line-of-sight path. A line-of-sight path is exactly what it sounds like . . . a "straight path" where there is nothing between the receiver and the UMT but air and where the distance between the UMT and the remote receiver is minimized.

Notably, the UMTS are installed in a water meter pit below ground level and they do not move. Thus, what is needed is a "Remote Receiver" that can move to achieve a line-of-sight propagation path between a stationary UMT and the Remote Receiver and minimize the distance between same. Walk-by and Drive-by systems do such to a certain extent, but such systems do not maximize the process. What is needed is a system that leverages the low power benefits of walk-by and drive-by systems while providing real time or near real time data services while transferring technology costs from the UMT to the remote receiver.

The disclosed technology achieves the most cost-effective ARM system comprising a Universal Meter Transmitter (UMT) that operates in a plurality of modes such as the walk-by, drive-by, and fixed network modes as well as a new "fly-by" mode disclosed in this document without the need for hardware changes. For the disclosed fly-by modes, the receiver is preferably associated with a hybrid lighter than air technology (e.g. blimp) and electric powered drone system. The "blimp" does the heavy lifting and the drone technology handles the maneuvering to address the above described RF propagation path issues. One such drone system is simply a drone that flies straight up (Drone Tower™) when collecting data and then returns to its base. Another drone-based system is a hybrid between a drive-by and fixed network that creates a new "Fly-By" mode.

It should be appreciated that the disclosed drone-based system allows the Meter Transmitter to transmit at a lower power level which allows a manufacture to configure the UMT to transmit at a lower power thereby prolonging battery life and/or allowing the use of lower cost batteries while improving data collection efficiency while also transferring costs from the Meter Transmitter to the Remote Receiver.

SUMMARY

Objects and advantages of the invention will be set forth in the following description, or may be obvious from the description, or may be learned through practice of the invention.

Broadly speaking, a principal object of the present invention is to provide a data transfer system configured for transferring data from a data source to a data user.

Another general object of the present invention is to provide a system for transferring utility meter data from a utility customer to a utility company.

Yet another object of the present invention is to provide a system for transferring utility meter data from a utility customer to a utility company where the utility meter transmitter power level is minimized while providing real-time-data services.

Still another object of the present invention is to provide a system for transferring utility meter data from a utility customer to a utility company where the utility meter transmitter power level is minimized while providing real-time-data services where such system uses drone technology.

Another object of the present invention is to provide a system for transferring utility meter data from a utility customer to a utility company where the utility meter transmitter power level is minimized while providing real-time-data services where such system uses drone technology and where the system is self-calibrating to achieve and maintain the minimal transmitter power level for the utility meter transmitter.

Additional objects and advantages of the present invention are set forth in, or will be apparent to those skilled in the art from, the detailed description herein. Also, it should be further appreciated that modifications and variations to the specifically illustrated, referenced, and discussed steps, or features hereof may be practiced in various uses and embodiments of this invention without departing from the spirit and scope thereof, by virtue of the present reference thereto. Such variations may include, but are not limited to, substitution of equivalent steps, referenced or discussed, and the functional, operational, or positional reversal of various features, steps, parts, or the like. Still further, it is to be understood that different embodiments, as well as different presently preferred embodiments, of this invention may include various combinations or configurations of presently disclosed features or elements, or their equivalents (including combinations of features or parts or configurations thereof not expressly shown in the figures or stated in the detailed description).

Additional embodiments of the present subject matter, not necessarily expressed in this summarized section, may include and incorporate various combinations of aspects of features or parts referenced in the summarized objectives above, and/or features or components as otherwise discussed in this application.

Those of ordinary skill in the art will better appreciate the features and aspects of such embodiments, and others, upon review of the remainder of the specification.

BRIEF DESCRIPTION OF THE DRAWINGS

A full and enabling description of the present subject matter, including the best mode thereof, directed to one of ordinary skill in the art, is set forth in the specification, which makes reference to the appended figures, in which.

Figure 1:
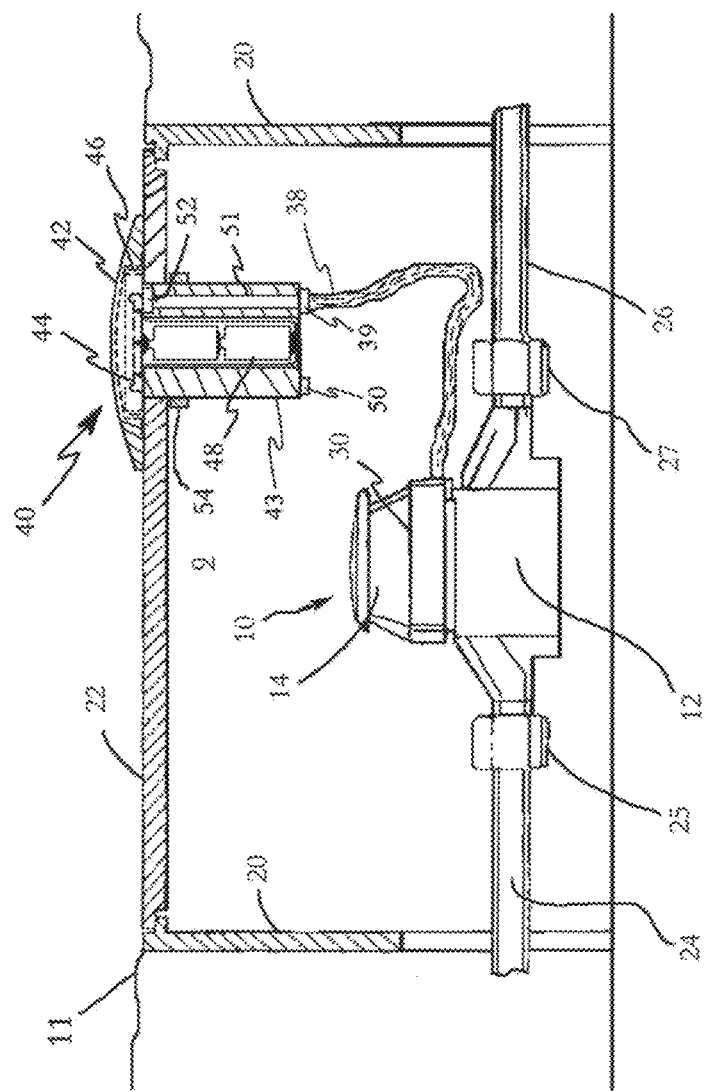
FIG. 1 is a side elevation view of a graphic illustration of an in ground pit (9) enclosure, including a partial cut away section, housing a fluid meter attached to a communication apparatus.

Repeat use of reference characters throughout the present specification and appended drawings is intended to represent the same or analogous features or elements of the present technology.

DETAILED DESCRIPTION

Reference now will be made in detail to the embodiments of the invention, one or more examples of which are set forth below. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used on another embodiment to yield a still further embodiment. Thus, it is intended that the present invention covers such modifications and variations as come within the scope of the appended claims and their equivalents. Other objects, features, and aspects of the present invention are disclosed in or may be determined from the following detailed description. Repeat use of reference characters is intended to represent same or analogous features, elements or steps. It is to be understood by one of ordinary skill in the art that the present discussion is a description of exemplary embodiments only and is not intended as limiting the broader aspects of the present invention.

For the purposes of this document two or more items are "mechanically associated" by bringing them together or into relationship with each other in any number of ways including a direct or indirect physical "releasable connections" (snaps, screws, Velcro®, bolts, etc.—generally connections designed to be easily and frequently released and reconnected), "hard-connections" (welds, rivets, macular bonds, generally connections that one does not anticipate disconnecting very often if at all and that generally needs to be "broken" to separate), and/or "moveable connections" (rotating, pivoting, oscillating, etc.). A "mechanical association" includes any and all of the above.

Similarly, two or more items are "electrically associated" by bringing them together or into relationship with each other in any number of ways including: (a) a direct, indirect or inductive communication connection, and (b) a direct/indirect or inductive power connection. In addition, while a drawing or image may depict a particular electrical association as a single line, such a connection may represent a plurality of wired connections or cables comprising multiple conductors as required for the application of interest. An electrical association includes any and all of the above.

This document includes headings that are used for place markers only. Such headings are not meant to affect the construction of this document, do not in any way relate to the meaning of this document nor should such headings be used for such purposes.

While the particulars of the present invention are described using examples primarily in the context of water consumption it should be appreciated that the disclosed Automatic Meter Reading (AMR) capabilities and associated technology may be used with any type of utility meter metering the consumption of commodities such as liquids (gas, water, oil, etc.) and electricity.

FIG. 1 shows a side view, including a partial cutaway section, of an exemplary water meter (10) configured with Automatic Meter Reading (AMR) technology wherein the meter is housed in a below ground enclosure (9), hereafter referred to as pit (9). Pit (9) is shown comprising sides (20) and lid (22). Water meter (10) is shown comprising a fluid chamber (12) and a register (14). The bottom of register (14) releasably attaches to the top of fluid chamber (12) forming an enclosed void (not shown) between register (14) and fluid chamber (12). Fluid chamber (12) comprises water inlet (25) and water outlet (27). Water line (24), connects to a water source at one end, runs into pit (9) and attaches to fluid chamber inlet (25) at the opposite end. Water line (26) attaches to fluid chamber outlet (27) at one end and continues through pit (9) to a water consumer. Fluid chamber (12) further houses a moving element (e.g. rotating element, oscillating element etc., hereafter simply rotating element; not shown) that is placed in the path of fluid flow through the meter. The rotating element may be constructed of magnetic material or, alternatively, may be associated with magnetic material (e.g. a magnet). As the rotating element rotates in response to fluid flow through meter (10), a rotating magnetic field is generated. It will be appreciated that the rotating element in fluid chamber (12) may be replaced by other technologies that create other types of magnetic fields that vary over time (e.g. an oscillating element that generates an oscillating magnetic field) without departing from the scope of this invention.

Register (14) houses elements for detecting a rotating magnetic field and associating such rotations with water consumption thereby generating resource consumption data. Register (14) may also houses components for displaying consumption data. Alternatively, Register (14) may simply output pulses to an electronic device associated with register (14) wherein such pulses are relatable to the amount of water flowing through meter (10). Such technology is well known and understood by those skilled in the art and a detailed explanation thereof is not necessary for purposes of describing the method and system according to the present invention.

Figure 3:
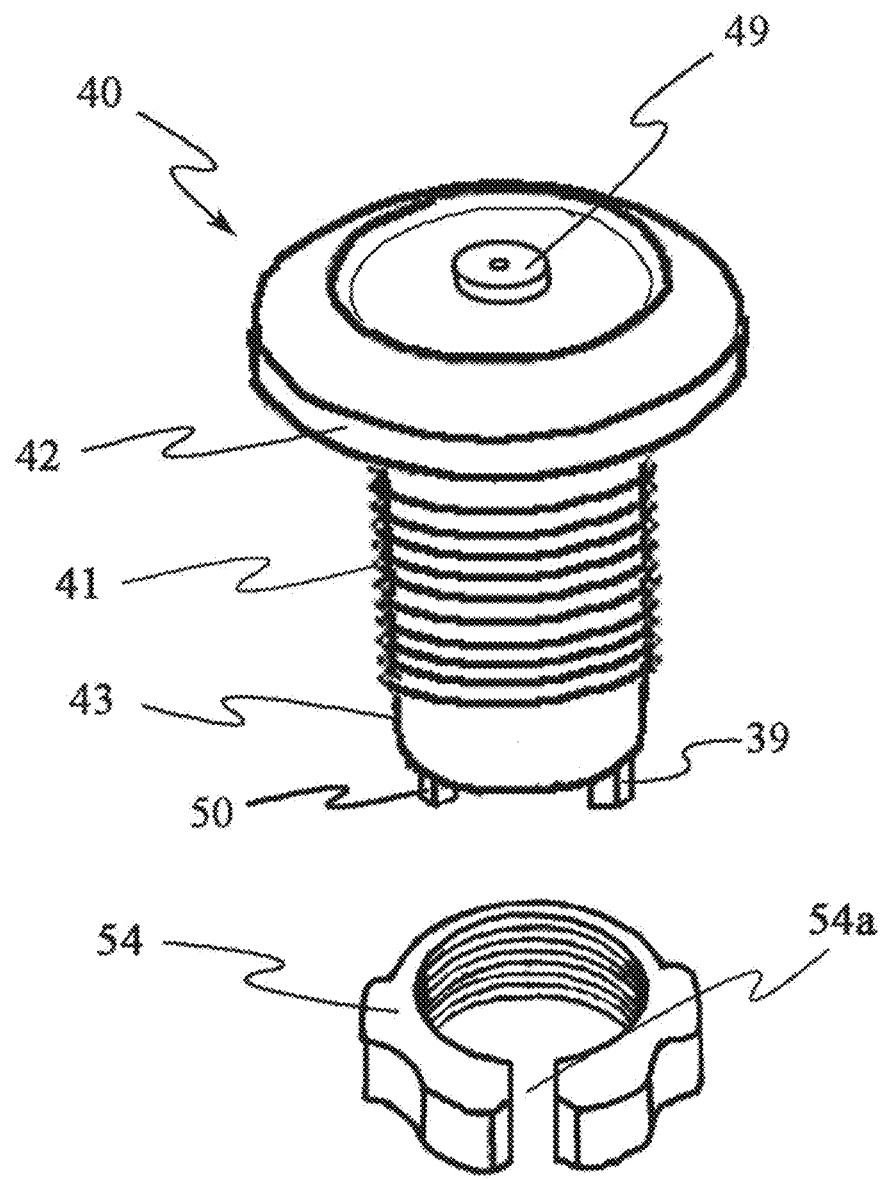
FIG. 3 is a side perspective view of one exemplary embodiment of a communication apparatus with securing nut (54)

Also shown in FIG. 1 is a communication apparatus (40) for transmitting data from meter (10) to a remote location. Communication apparatus (40) comprises an enclosure having a top-section (42) and a depending base (43). Top-section (42) rests generally on top of the pit lid (22) substantially adjacent to an opening through the pit lid. Depending base (43) extends from top-section (42) to a point at least partly through the pit lid opening. As can be seen in FIG. 1, depending base (43) extends completely through pit lid (22). For this embodiment of the invention, communication apparatus (40) is associated with meter (10) through a wire communication link (38). As shown in FIG. 3, depending base (43) may further comprise threads (41) suitably sized for receiving securing nut (54). Securing nut (54) may include gap (54a) to provide a means for installing and removing securing nut (54) without disconnecting communication link (38).

Figure 2:
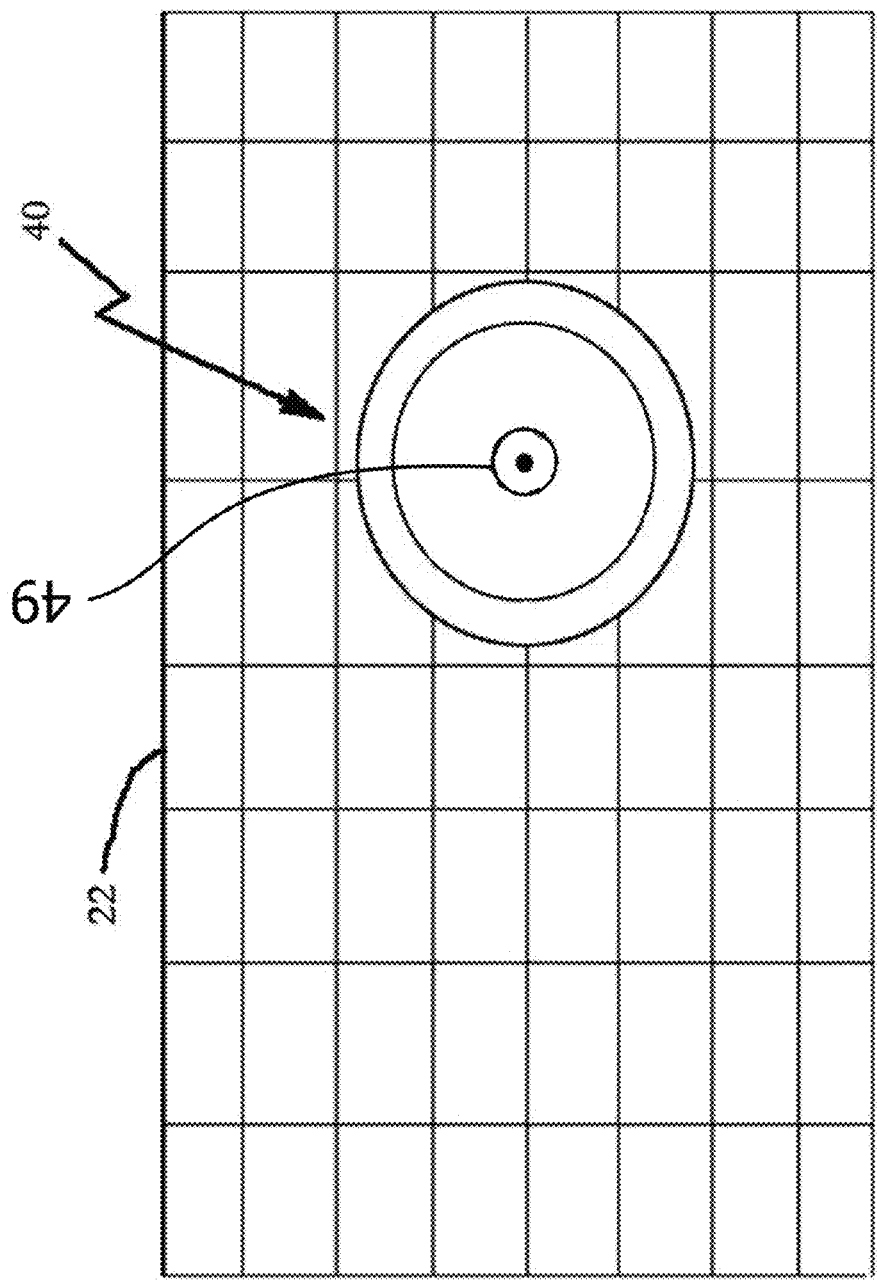
FIG. 2 is a top plane view a one exemplary embodiment of a communication apparatus resting generally on top of a pit lid (22)

FIG. 2 shows a top plan view of communication apparatus (40) resting generally on top of pit lid (22). Coil/core interface (49) is shown in the center of top-section (42) although interface (49) may be located anywhere on top-section (40) without departing from the scope of the present invention. It should be noted that for the meter installation shown in FIG. 1, pit lid (22) is generally at ground level. It will be appreciated, however, that communication apparatus (40) may be installed in above ground enclosures and pit lid (22) may be the side of such enclosure without departing from the scope and spirit of the present invention.

Figure 4:
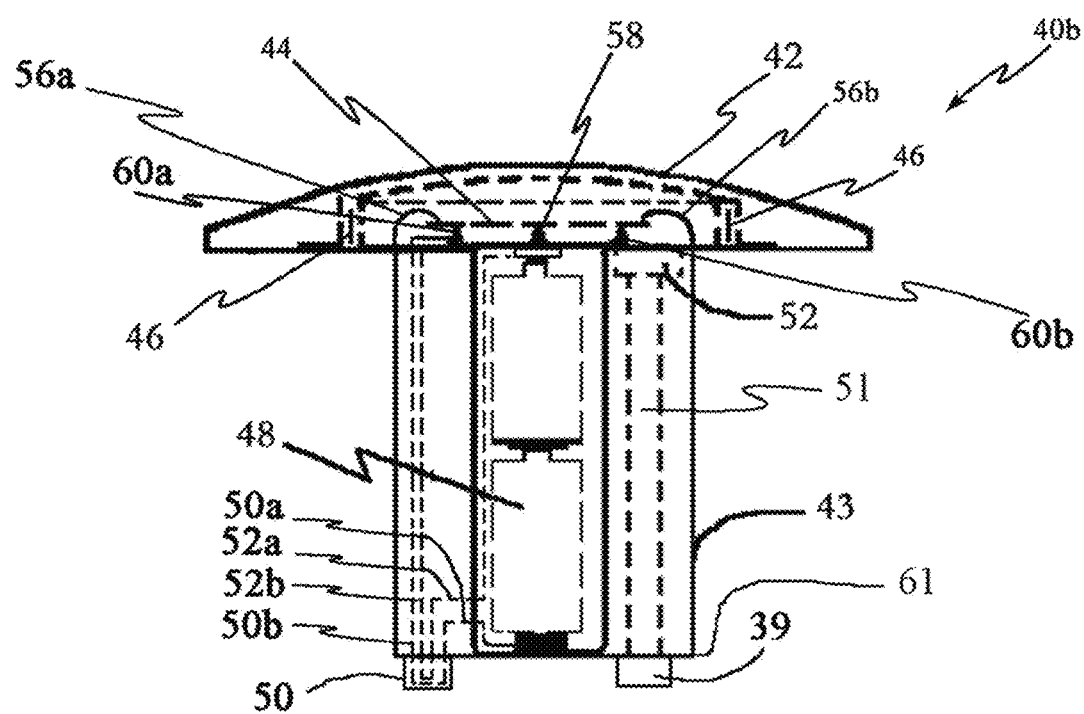
FIG. 4 is a side elevational view, with a partial phantom view, of a communication apparatus housing comprising a top-section and a depending base.

Referring now to FIG. 4, a side view, including a partial phantom view, of one embodiment of communication apparatus (40) is shown. Communication apparatus (40) has a circuit board (44) disposed within top-section (42) and supported by stand-offs (58, 60a, 60b). Circuit board (44) may also be secured in top-section (42) by plastic grip tabs integral to the housing or any other suitable means. For this embodiment, stand-off (60a) and stand-off (60b) also provide a ground connection between circuit board (44) and power source (48) (described later). Stand-off (58) provides a power connection to circuit board (44). Resilient board clips (56a, 56b) secure circuit board (44) against the stand-offs thereby securing the circuit board within top-section (42). Such resilient clip/stand-off technology provides for a bolt/screw free design that simplifies assembly and lowers manufacturing costs.

Figure 5:
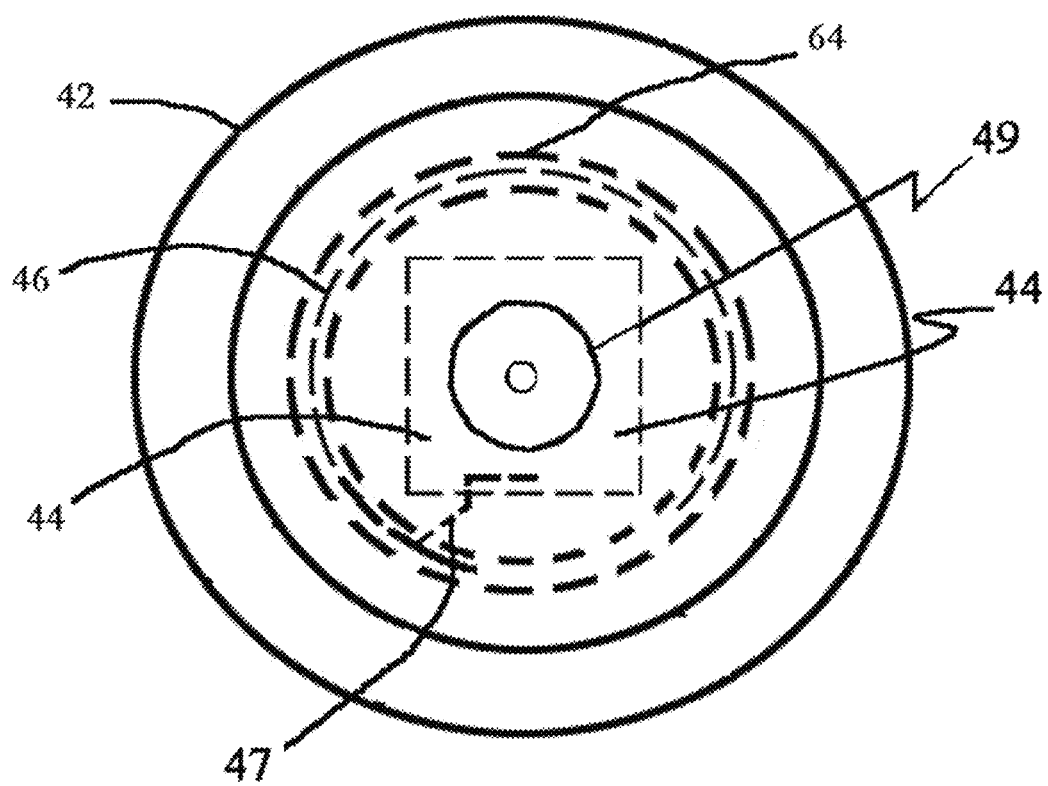
FIG. 5 is a top plan view of a transmitter top section including a partial phantom view thereof.

Circuit board (44) comprises transmitter circuitry (one exemplary transmitter is described below) associated with antenna (46). It should be noted that the transmitter circuitry may be associated with any type of substrate other than a circuit board without departing from the scope and spirit of the disclosed inventions. Both circuit board (44) and antenna (46) are at least partially disposed within top-section (42). Additionally, antenna (46) may be disposed at least partially outside of top-section (42) to facilitate an improved electromagnetic radiation pattern. Alternatively, antenna (46) may be integral to circuit board (44), such as a trace or a slot antenna formed on/within circuit board (44). As shown in FIG. 5, for this embodiment of the invention, antenna (46) is positioned in antenna guide (64) and at least partially circles circuit board (44). Any type of suitable antenna technology may be used and such antenna technology is well known and understood by those skilled in the art, and a detailed explanation thereof is not necessary for purposes of describing the method and system according to the present invention.

Antenna (46) is coupled to the transmitter circuitry via connector (47). Notably, any suitable apparatus or method may be used for associating antenna (46) directly or inductively to the transmitter circuitry so that data-signals generated by the transmitter are propagated by antenna (46) to a remote location. Exemplary remote locations include a hand held computer, perhaps just a few feet away (walk-by) from the meter installation or hundreds of feet away. A remote location may be in a vehicle equipped with a receiver wherein the vehicle is driven by the location where the meter is installed (drive-by). Depending on the transmitter power level, a remote location may be miles away from the meter installation site (fixed network).

As shown in FIG. 4, a power source (48) is associated with circuit board (44) via wired connections (50a, 50b, 52a, 52b) and is configured for supplying power to the circuitry on circuit board (44). For this embodiment of the present invention, power source (48) comprises two batteries connected in series and disposed within depending base (43). It will be appreciated that power source (48) may only comprise one battery or three or more batteries without departing from the scope and spirit of the invention.

As noted earlier, the transmitter circuitry is associated with meter (10) through a wired transmitter-meter communication link (38) (FIG. 1). For this embodiment of the invention, wired conductors provide a connection between register (14) and depending base connector (39). A communication link runs through conduit (51) to communication connection (52) associated with transmitter board (44). Transmitter-meter communication link (38) is configured for transferring system-data between the transmitter and the meter. System-data is any data generated by meter (10), communication apparatus (40), or stored by a memory associated with the meter (10) or the communication apparatus (40). Exemplary system-data includes a meter identification number, consumption data, tamper data, battery status data, time data, system diagnostic data, or any other type of data. Transmitter-meter communication link (38) will be described in more detail below.

For meter installations located in hostile environments, such as water meter installations below ground in a pit which can become filled with water, the components within communication apparatus (40) should be adequately protected. For such embodiment of the invention, a potting compound or a sealing material may be use to protect various components of communication apparatus (40). Any suitable potting compound may be used including polymer based materials such as polyurethane or a fiberglass base material. Additionally, suitable sealants include a vulcanizing adhesive/sealant. The potting/sealing material may be injected into the housing thereby encasing substantially all of the top-section (42) components and depending base (43) components within the housing. It will be appreciated that when a potting material/sealant is used to encase the components within top-section (42) and depending base (43) as described above, such components can no longer be easily accessed for replacement or repair.

Alternatively, the housing may be constructed such that only the distal end (61) of depending base (43) has an opening allowing access to the inside of the housing. The distal end (61) may be sealed by a removable end cap (not shown) to prevent contaminates from reaching components within the housing. Such an arrangement could be configured to allow the components within top-section (42) and depending base (43) to be accessed for replacement or repair. It will be appreciated that any type of sealing material or method of sealing the internal components of top-section (42) and depending base (43) within the housing may be used without departing from the scope of the invention.

Referring back to FIG. 4, power source (48) is now considered. For the currently preferred embodiment of the present invention, power source (48) comprises two AA lithium batteries although any type and number of batteries may be used without departing from the scope of the invention. Power source (48) is associated with circuit board (44) through a multiple conductor wired connection (50a, 50b, 52a, 52b). Conductor (50a) attaches to the negative component of power source (48) at one end, and to auxiliary power connector (50) at the other end. Conductor (50a) is coupled to conductor (50b) within auxiliary power connector (50). Conductor (50b) provides an electrical connection between stand-off post (60a), stand-off post (60b), and conductor (50a). Similarly, conductor (52a) attaches to the positive component of power source (48) at one end, and to auxiliary power connector (50) at the other end. Conductor (52a) is coupled to conductor (52b) within auxiliary power connector (50). Conductor (52b) provides an electrical connection between stand-off post (58) and conductor (52a). One of ordinary skill in the art will appreciated that auxiliary power connector (50) provides a method of connecting additional power sources to communication apparatus (40) as well as providing a means for disconnecting power source (48) from circuit board (44). Such a configuration is particularly useful when power source (48) is encased in a potting material as described above.

Figure 6:
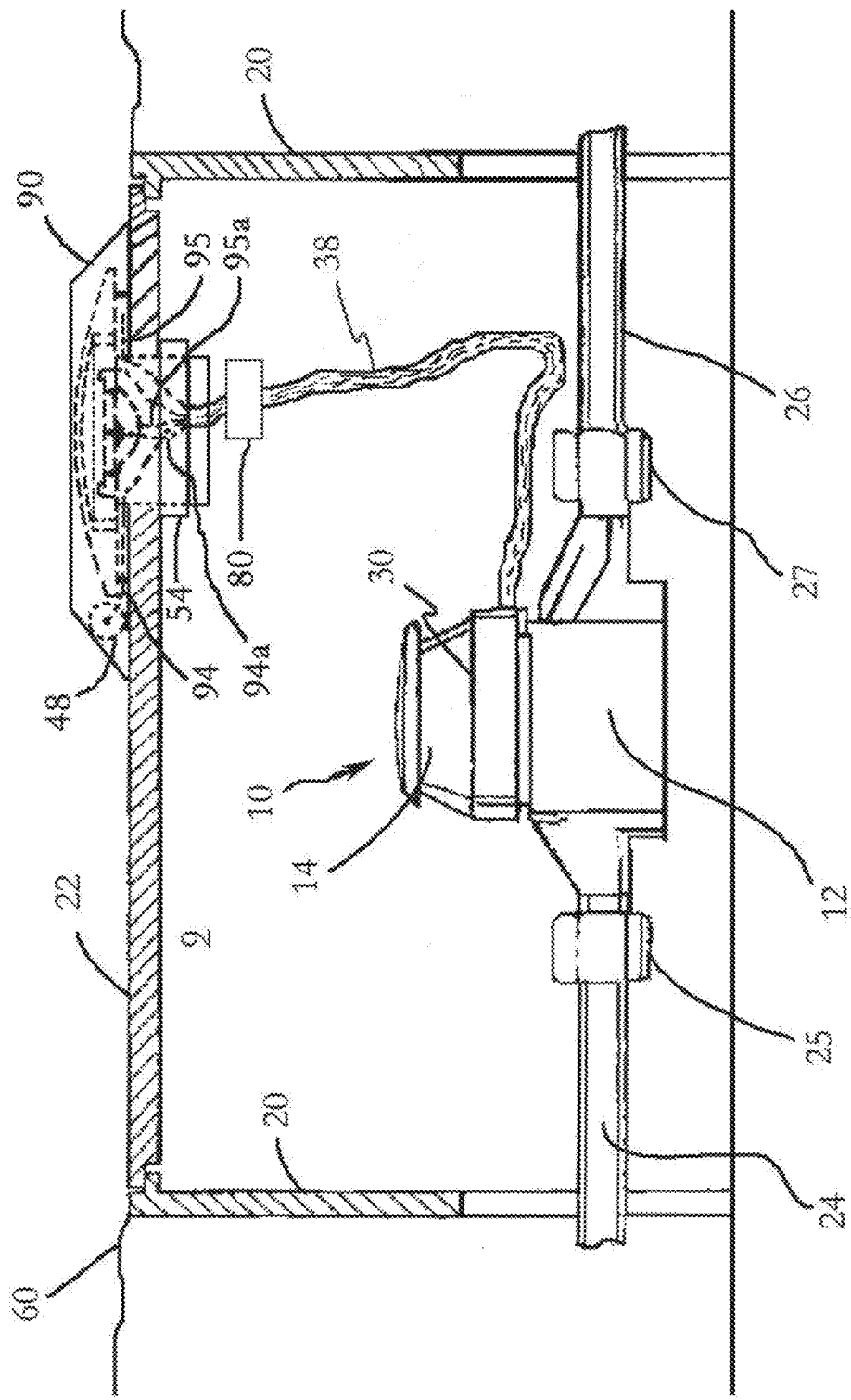
FIG. 6 is a side elevational view of a graphic illustration of an in ground pit (9) enclosure, including a partial cut away section, housing a fluid meter attached to a communication apparatus comprising an energy converter for recharging or supplying a trickle charge to a power source.

Referring now to FIG. 6, another alternative embodiment of the present invention is disclosed. For this embodiment of the present invention, power source (48), the transmitter and antenna (64) are all located above pit lid (22). Power source (48) comprises a rechargeable battery pack connected to an energy-converter (90). An energy-converter is simply a device that converts energy from one form to another. One example of an energy-converter is photovoltaic-radome (90) which generates electricity by absorbing electromagnetic radiation. Another example of an energy-converter is a betavoltaic device (described later).

Figure 7:
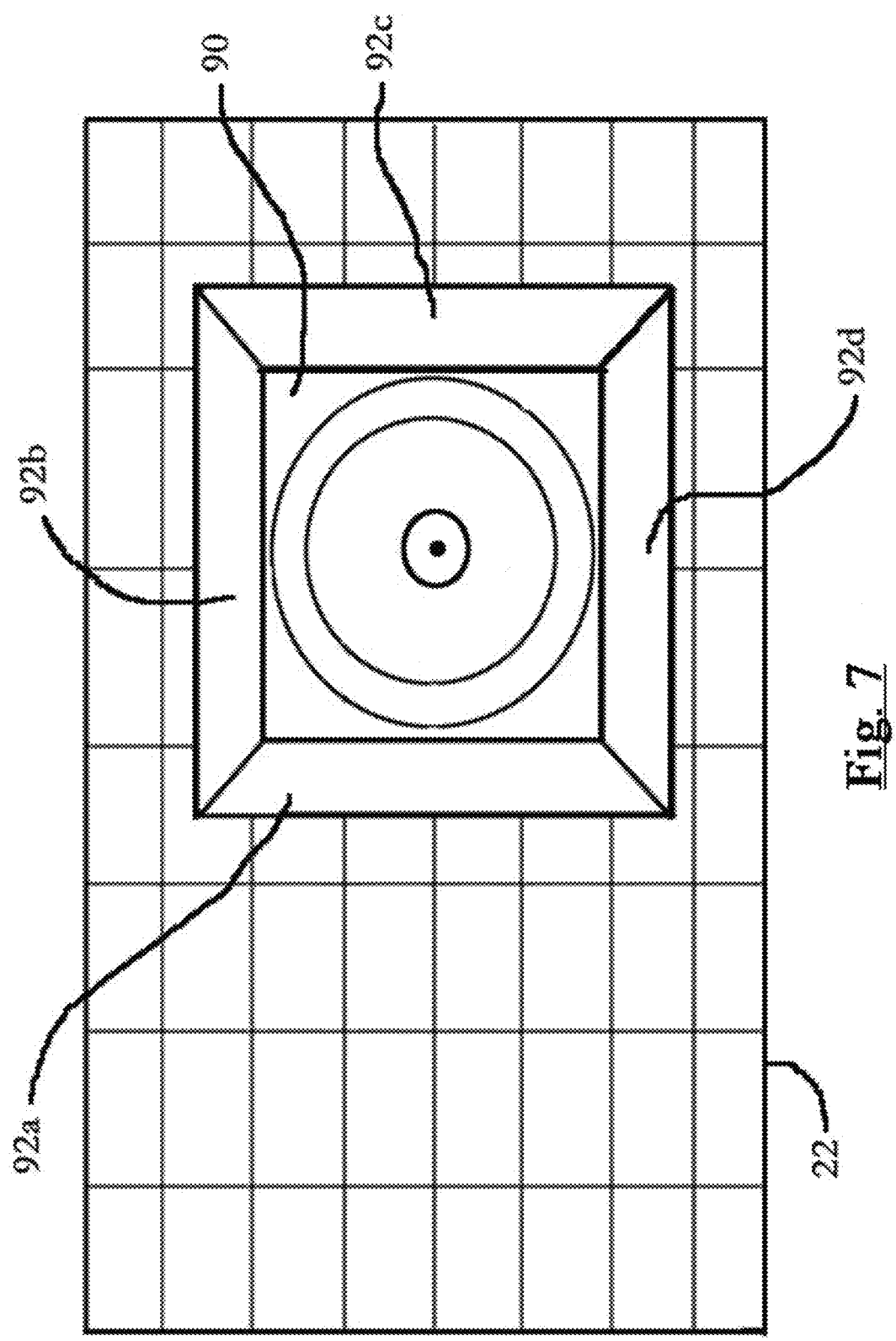
FIG. 7 is a top plan view of pit lid (22) and a communication apparatus comprising an energy converter.
Figure 8:
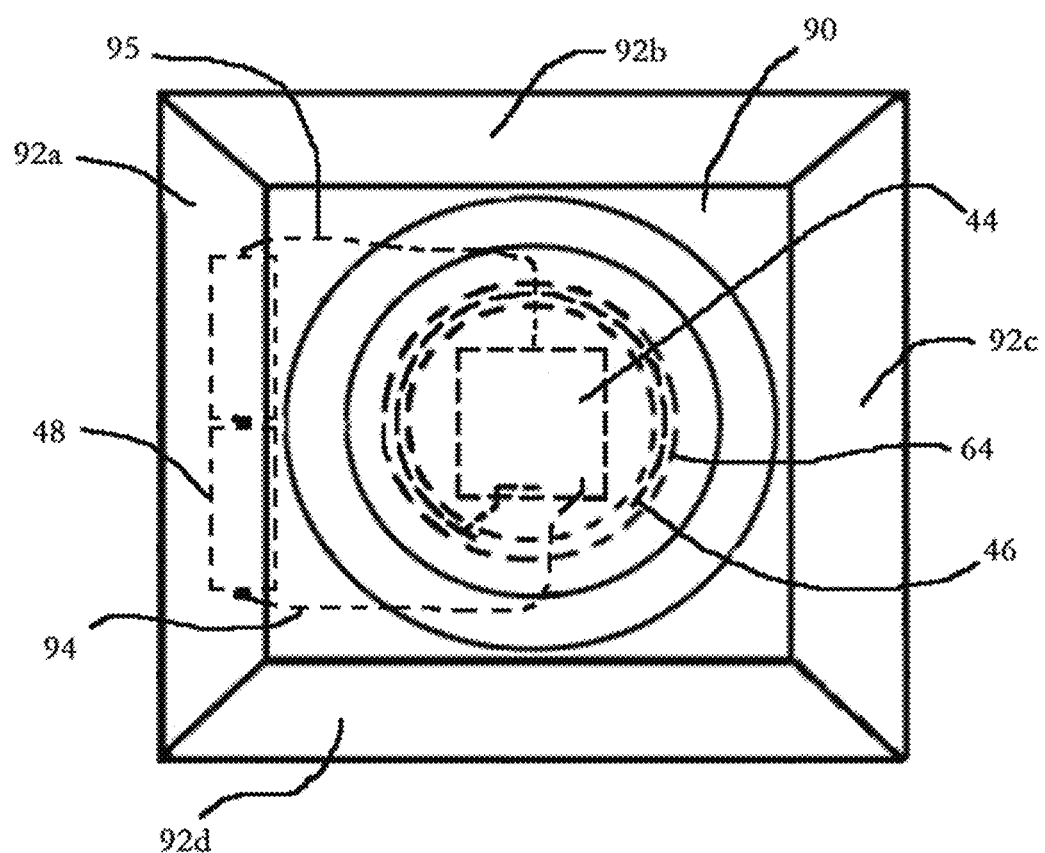
FIG. 8 is a top plan view of pit lid (22) and a communication apparatus comprising an energy converter including a phantom view of an above pit lid power source connected to circuit board (44)

FIG. 7 shows a top plan view of communication apparatus (40) comprising energy converter (90). FIG. 8 also shows a top plan view of communication apparatus (40) with an additional phantom image of power source (48) connected to circuit board (44) via power conductor (94) and ground conductor (95). For this embodiment of the invention, energy converter (90) has four sections of photovoltaic cells (92a, 92b, 92c, 92d) surrounding top-section (42). It will be appreciated that the number and shape of sections (92a-92d) and the number and shape of photovoltaic cells comprising each section may vary depending on any number of parameters including: cost, anticipated installation conditions, antenna design requirements, and power requirements. For the preferred embodiment, each photovoltaic cell section includes three photovoltaic cells, each supplying about 0.5 volts at 30-50 milliamps in full sunlight. Such photovoltaic cells are preferably connected in series to provide power to communications apparatus (40) and/or supply a charging current to power source (48). Additionally, to lower costs, the number of photovoltaic cells may be reduced to supply a simple trickle charge to power source (48) thereby extending the expected life of power source (48).

Similarly, power to communications apparatus (40) may be supplied by a betavoltaic device. The betavoltaic device uses a plurality of PN junctions in silicon to capture and convert electrons emitted from a radioactive gas, such as tritium, into a current. The PN junctions are arranged so as to form a "Dyson shell" surrounding the radioactive gas. To further increase efficiency, the surface area of the silicon surface is increased by adding indentions in such surface. Such indentions are preferably about 1 µm wide and about 40 µm deep. The size of the Dyson shell is selected depending on the application. A relatively smaller shell is selected when the betavoltaic device supplies a trickle charge to power source (48) compared to a relatively larger size shell when the betavoltaic device is used as power source (48) (i.e. a nuclear battery). The Dyson shell may take any suitable form including a sphere, a rectangular box, or a cylindrical tube similar in shape to a typical battery. The techniques for interconnecting PN junctions to form a shell as well as the techniques for adding indentions to the surface of PN junctions are well known in the art and a detailed explanation thereof is not necessary for purposes of describing the method and system according to the present invention.

In yet another embodiment of the invention, the above described hosing comprising top-section (42) and depending base (43) may be formed integral to a pit lid forming a one-piece module. Alternatively, the pit lid may be configured to house the various components described above. For this embodiment of the invention, the module comprises a module pit lid suitably sized to replace pit lid (22). A battery operated RF transmitter is disposed within the module pit lid. As described above, the RF transmitter is associated with an electronic device through either a wired or wireless communication link configured for transferring system-data between the RF transmitter and the electronic device. The electronic device may be register (14) or some other device in communication with register (14). An antenna is also associated with the RF transmitter and configured for propagating data-signals generated by the RF transmitter to a remote location outside the pit. As before, such data-signals may comprise at least part of said system-data.

Figure 9:
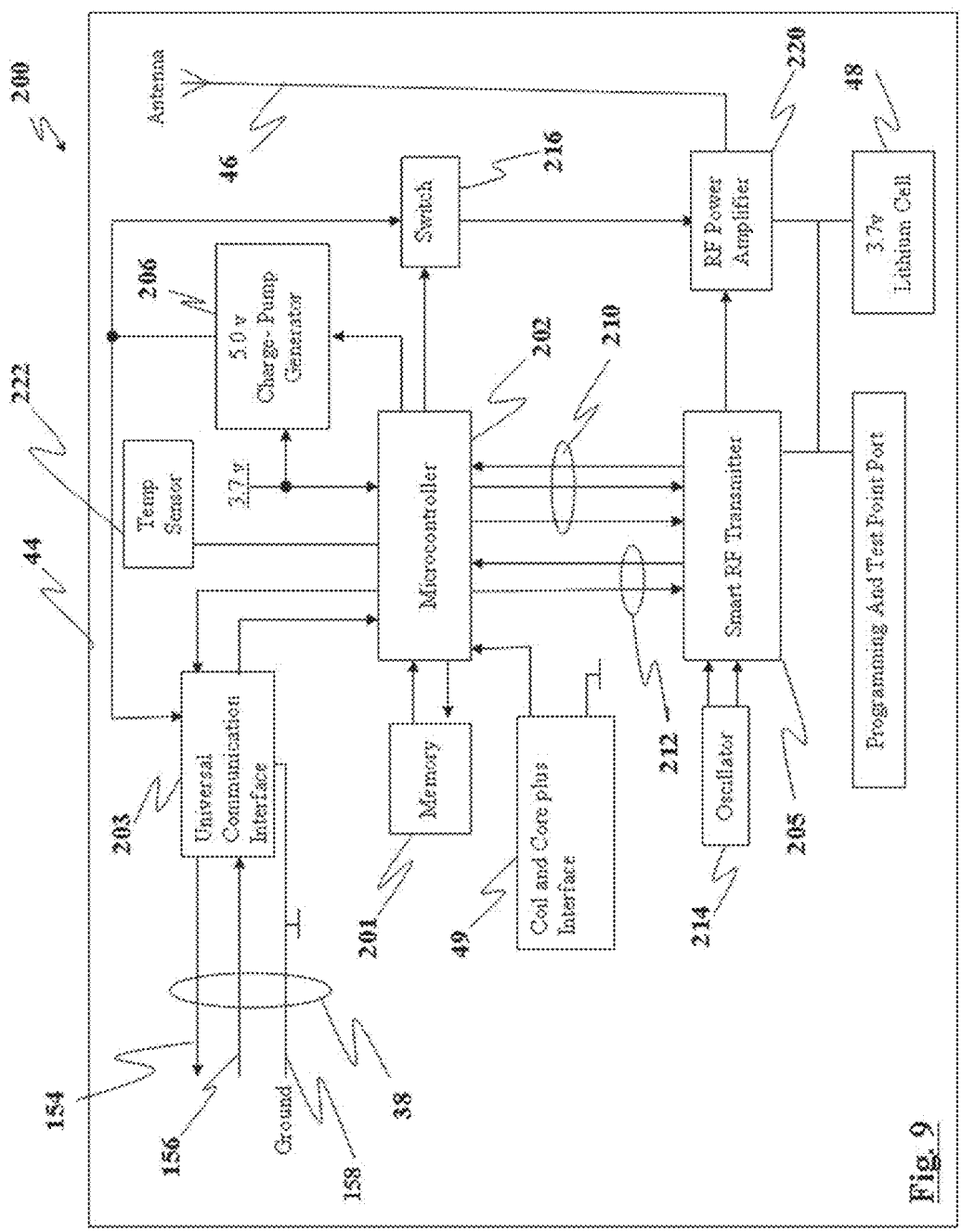
FIG. 9 is a block diagram illustration of one embodiment of a transmitter and associated circuitry.
Figure 10:
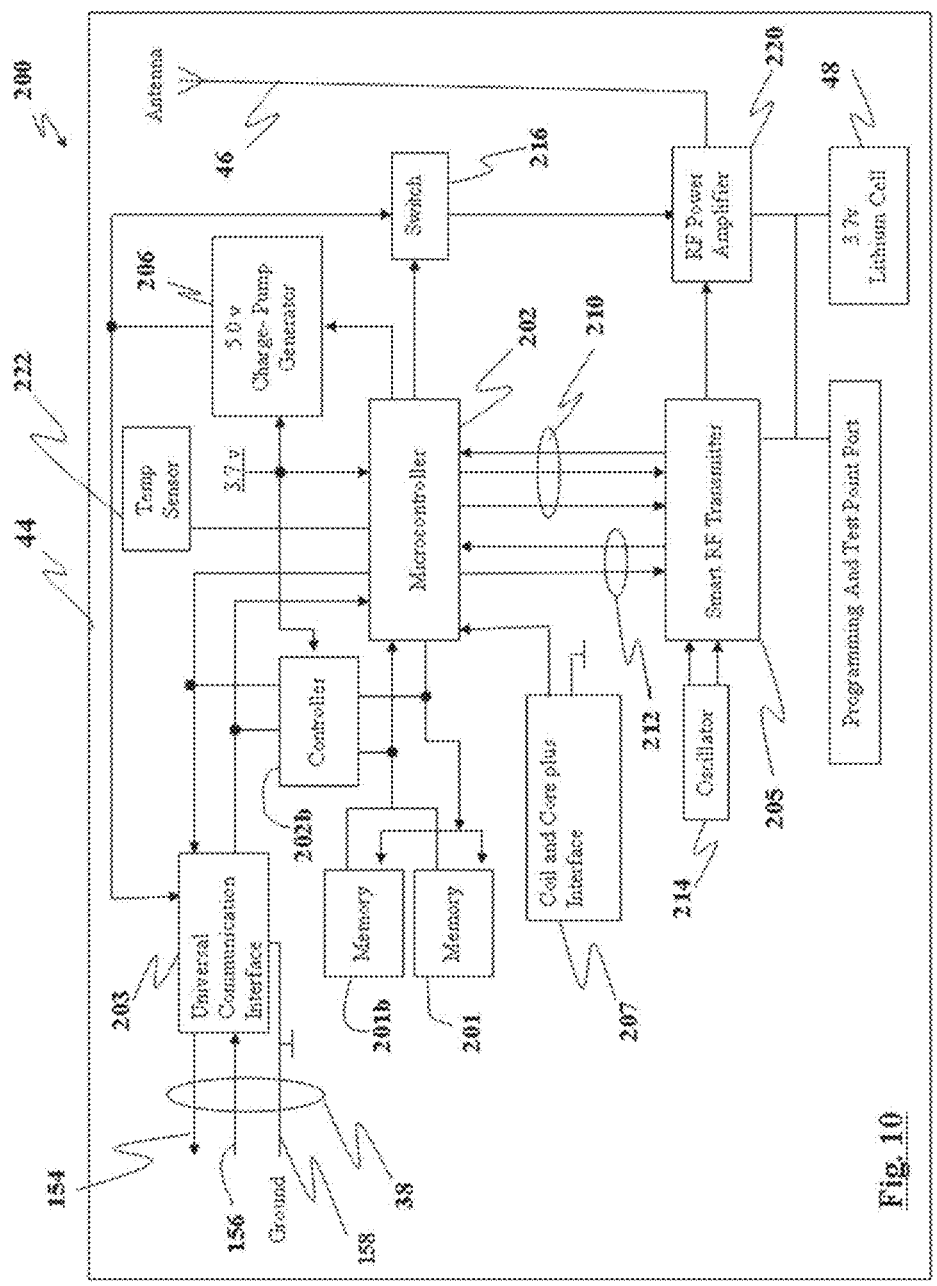
FIG. 10 is a block diagram illustration of one embodiment of a transmitter and associated circuitry including data-logger circuitry.

One embodiment of the transmitter circuitry located on circuit board (44) is now considered. Referring to FIG. 9, transmitter (200) is depicted in a block diagram representation. Transmitter (200) communicates with external devices either by transmitting a data-signal over antenna (46), through universal communication interface (203), or coil/core interface (49). In the preferred embodiment, transmitter (200) is connected to an electronic device associated with meter (10) via universal communication interface (203) and communication link (38). Such electronic device may be register (14) or an electronic device associated with register (14) and any type of communication interface may be used in place of universal communication interface (203) without departing from the scope of the present invention.

For the preferred embodiment, communication link (38) is a three conductor cable comprising two data lines (154, 156) and a ground (158) (or a data line, power line, ground line) over which serial communications is conducted. Such data lines may be routed through terminal block (80) to provide a means for connecting additional electronic devices to communication apparatus (40). For example, a laptop computer may be connected through terminal block (80) to facilitate reprogramming of communication apparatus (40). Such terminal block (80) is particularly useful for embodiments of communication apparatus (40) not having a receiver.

It will be appreciated that other wiring configurations and communication protocols may be used over wired or wireless communication connections and interfaces without departing from the scope of the present invention. When transmitter/reader communication interface (203) is connected to register (14) or an electronic device associated with register (14), such interface facilitates the transfer of data from electronic device/register to remote meter reading equipment via data signals propagated by antenna (46). When transmitter/reader communication interface (203) is connected to a computing device, such interface facilitates programming or reprogramming of the transmitter.

Transmitter (200) may also be programmed or reprogrammed by connecting a programming device, such as a laptop computer, inductively through coil/core interface (49). Coil/core interface (49) may also be used to perform firmware upgrades. Coil/core interface (49) may also be associated with touchpad technology to facilitate manual reading using an inductive probe.

As noted above, for the preferred embodiment, power is supplied to the transmitter electronics by power source (48). For one embodiment of the present invention, power source (48) is a single 3.7 Volt lithium cell battery. As noted above, in other configurations, power source (48) may be two AA lithium batteries. For system components that require greater than 3.7 volts to operate, charge pump generator (206) is used to generate a voltage larger than the supply voltage from which it operates. For this embodiment of the present invention, charge pump generator (206) generates 5 volts. The output of charge pump generator (206) powers universal communication interface (203) and RF switch (216).

Transmitter (200) further comprises processor (202). One of the functions of processor (202) is to control data transfers between meter (14), memory (201), and remote meter reading equipment. It will be appreciated that memory (201) is optional and all data may be stored in memory located on microcontroller/processor (202). Processor (202) is further connected to coil/core interface (49). Coil/core interface

(49) is used to program microcontroller/processor (202) as well as facilitate bios/firmware upgrades. Coil/core interface (49) may also be used by processor (202) to provide touch pad functionality to the system. Such touch pad technology is well known in the art. One example is disclosed in U.S. Pat. No. 5,619,192 issued to Ayala filed Jun. 14, 1994 and such document is incorporated by this reference for all that it discloses.

Still referring to FIG. 9, processor (202) is shown connecting to temperature sensor (222). Temperature sensor (222) may be a discrete component, as shown in FIG. 9, or it may be incorporated within processor (202). Microcontroller (202) uses temperature sensor (222) to monitor the ambient temperature within the transmitter enclosure. Alternatively, a temperature sensor may be used to monitor the temperature of a particular component. Processor (202) may also generate and store temperature-data that is later used to make adjustments to various operating parameters for transmitter (200) as described later. Such temperature-data may also be transmitted to a remote computer.

Processor (202) further connects to RF transmitter (205). RF transmitter (205) may be a single-chip transmitter or a transmitter circuit comprised of discrete components. RF transmitter (205) transmits over a frequency range of 804 MHz to 940 MHz, although other frequency bands may be used without departing from the scope of the present invention. For example, RF transmitter (205) may be used in the well-known 402/426/429/433/868/916 MHz ISM/SRD band systems. For the preferred embodiment of the present invention, transmitter (205) is a single-chip design that comprises (i) a communication bus for configuring and controlling the operation of the transmitter, (ii) a programmable output power level, (iii) a programmable output frequency, and (iv) may be powered by a 3.7 volt power source. Such transmitters are well known in the art and are manufactured by MAXIM, ATMEL, INFINEON, Texas Instruments, and Chipcon.

Returning to FIG. 9, antenna (46) is shown connecting to RF power amplifier (220). The types of antennas that may be used include monopole, helical, and loop antennas. Antenna (46) is constructed so that its impedance matches the output impedance of RF power amplifier (220). For the preferred embodiment of the present invention, the output impedance of RF power amplifier (220) is 50Ω.

Processor (202) configures/reconfigures RF transmitter (205) through transmitter communication interface (210). For the preferred embodiment of the present invention, transmitter communication interface (210) is a serial interface. Through transmitter communication interface (210), processor (202) can make configuration adjustments that affect the transmitter output power level, the frequency of the transmitted signal, and the transmitting mode. Processor (202) transfers the data to be transmitted over transmitter data bus (212).

In FIG. 9, oscillator (214) is shown connecting to RF transmitter (205). Oscillator (214) (one exemplary embodiment of a reference-frequency-generator) generates the reference frequency used by RF transmitter (205) to establish the carrier frequency of the transmitted signal. For the preferred embodiment, oscillator (214) is a crystal oscillator that oscillates at a frequency of 14.7456 MHz although other references may be used. RF transmitter (205) generates the carrier frequency of the transmitted signal by multiplying the output of oscillator (214) by a frequency-multiplier-value derived by an equation programmed into transmitter (205). Such frequency-multiplier-value is derived at least in part using a frequency-adjustment-value supplied by processor (202).

Frequency Stability

It is well known that a stable transmitted signal frequency is desired in almost all wireless communication systems. The more stable the transmitted signal frequency, the lower the cost of the electronics making up the receiver required to receive the transmitted signal. As noted above, for the present invention, a crystal oscillator is used to establish the reference frequency used by RF transmitter (205) to generate the carrier frequency of the transmitted signal. It will be appreciated that should the output of oscillator (214) drift, the carrier frequency of the transmitted signal will drift by such drift amount times the frequency-multiplier-value. For example, for a transmitted data-signal carrier frequency of 900 MHz and reference frequency of 14.7456 MHz, the frequency-multiplier-value would be 61.03516. If the reference frequency drifts by only 0.147456 MHz (1%) the carrier frequency will drift by about 9 MHz to 909 MHz.

Unfortunately, the outputs of all crystals drift as the temperature of the crystal changes. The more stable the crystal output frequency in response to changes in temperature, the more expensive the crystal. Fortunately, the drift of some low cost crystals substantially follows a known drift curve or known drift rate.

For one embodiment of the present invention, low cost crystals are used for oscillator (214) where the output of such crystal drifts in response to changes in temperature according to either a known frequency curve or known frequency rate (frequency-drift-data). If the frequency drifts according to a known drift rate, this value is stored in memory (201). If the frequency drifts according to a known drift curve, frequency drift/temperature change data representing such drift curve are stored in table form in memory (201). Both forms of oscillator output drift data are stored in memory (201) and are called frequency-drift-data. Notably one can use a drift formula and calculate the drift. Using lower cost crystals is consistent with the goal of transferring cost to the remote receiver from the UMT.

For this embodiment of the present invention, processor (202) uses temperature sensor (222) to access real time (or near real time) temperature data relatable to the temperature of oscillator (214). For example, such temperature-data may be the ambient temperature within transmitter (200) enclosure, the ambient temperature within the pit (9), the temperature of at least part of the frequency-components that generate the reference-frequency. Processor (202) may store such temperature-data in memory (201) as well as transmit such temperature-data to a remote location.

Processor (202) may also compare such temperature-data to predefined temperature values. Such predefined temperature values may comprise max-temp value, min-temp value, and temp-range values. Such values are preferably predefined by a user and stored in memory (201). It should be apparent that such values would typically be selected by a user to signify possible problems should temperature sensor (222) generate temperature-data that exceeds or drops below a particular temperature value. For example, should processor (202) determine that temperature-data exceeds a predefined max-temp value, processor (202) may set a temperature-warning-flag and/or transmit at least one of the temperature-data and the max-temp value to a remote location.

Processor (202) then accesses the frequency-drift-data, determines a frequency-adjustment-value that substantially compensates for the expected drift in the reference-frequency due to a change in temperature, and sends the frequency-adjustment-value to RF transmitter (205) over transmitter communication bus (210). It should be appreciated that the frequency-adjustment-value may be incorporated into a configuration command that controls the RF transmitter (205) output frequency. Alternatively, the frequency-adjustment-value may be used by RF transmitter (205) in its calculations for determining the carrier frequency of the transmitted signal. For the purposes of this invention, regardless of whether processor (202) or RF transmitter (205) makes the frequency adjustment, a frequency-adjustment-value will be sent from processor (202) to RF transmitter (205) in one form or another (i.e. as part of a configuration command, as a discrete value, etc.).

Transmitted Power Level Stability

Considered next is the effect the status of power source (48) can have on the transmitted signal. As used in this document, the term "power quality" simply refers to any number of metrics typically used to benchmark the quality of the power provided by a power source. Such metrics include voltage level, current supplied, voltage level stability under load, etc., and provide a reference for tracking the status of a power source.

It is well known that the signal strength of a transmitted data-signal can weaken if the quality of power supplied to the transmitter/amplifier degrades beyond a certain point. For example, a transmitter may transmit a (X) dB signal when supplied with a voltage of 4.0 volts but transmit only a (X-.5) dB signal when supplied with a voltage of 3.7 volts.

Notably, the status of power source (48) that powers RF transmitter (205) and RF power amplifier (220) may degrade over time. As a result, the quality of power supplied by power source (48) will degrade over time. As shown in FIG. 9, the output of transmitter (205) is amplified by RF power amplifier (220). Should voltage supplied by power source (48) to RF power amplifier (220) drop (as the status of the power source degrades over time), the power level of the transmitted data-signal will also drop. Thus, the status of power source (48) is another parameter that processor (202) monitors.

Initially, power-level-adjustment-data is either calculated or experimentally measured. For example, the strength of a data-signal transmitted by transmitter (205) may be monitored as the voltage supplied to transmitter 205 and/or RF power amplifier (220) is varied. Any change in transmitted data-signal strength is documented for each supplied voltage level. Such power-level-adjustment-data may be stored in table form in a memory associated processor (202) or the formula used to calculate power-level-adjustment-data may be used by processor (202).

Processor (202) is configured to measures the voltage supplied by power source (48). Processor (202) then accesses the power-level-adjustment data stored in memory (201). Using the power-level-adjustment data and the measured voltage level supplied by power source (48), processor (202) reconfigures RF transmitter (205) to transmit at a power level that maintains a substantially constant transmitted data-signal power level. This configuration may be used to provide for a substantially constant transmitted data-signal power level as power source (48) degrades over time.

Processor (202) may additionally generate power source status data and may transmit such data to a remote location using RF transmitter (205).

Notably, today's batteries use technology that maintains its supplied voltage level to within the last 15% of its life. When such battery technology is used the processor (202) may be programmed to allow the power level to drop to extend battery life at the cost of transmitted signal power level.

Multiple Mode AMR Device Configurations

Figure 11:
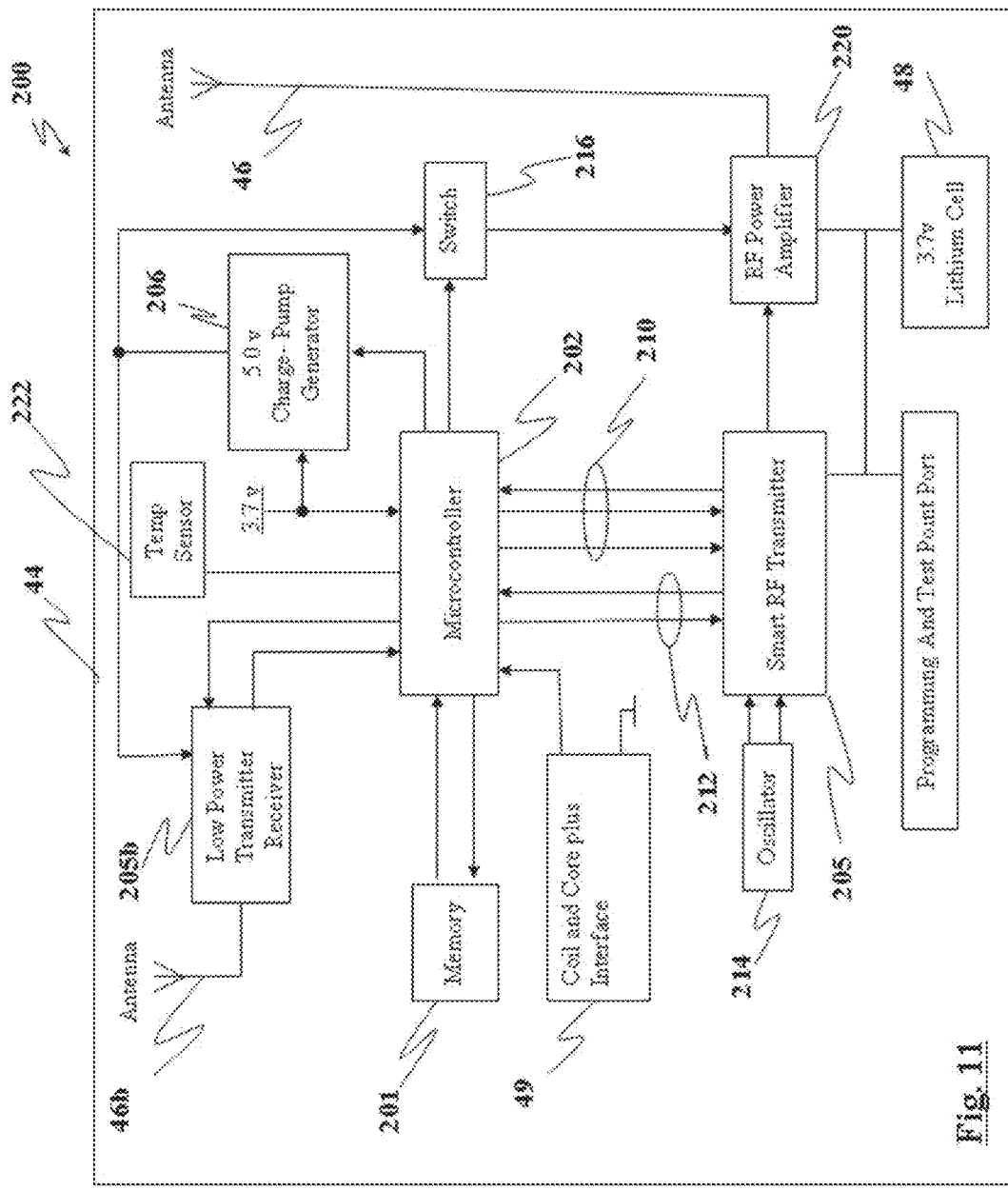
FIG. 11 is a block diagram illustration of one embodiment of a transmitter and associated circuitry including a wireless communication link comprising a receiver and a low powered transmitter.
Figure 12:
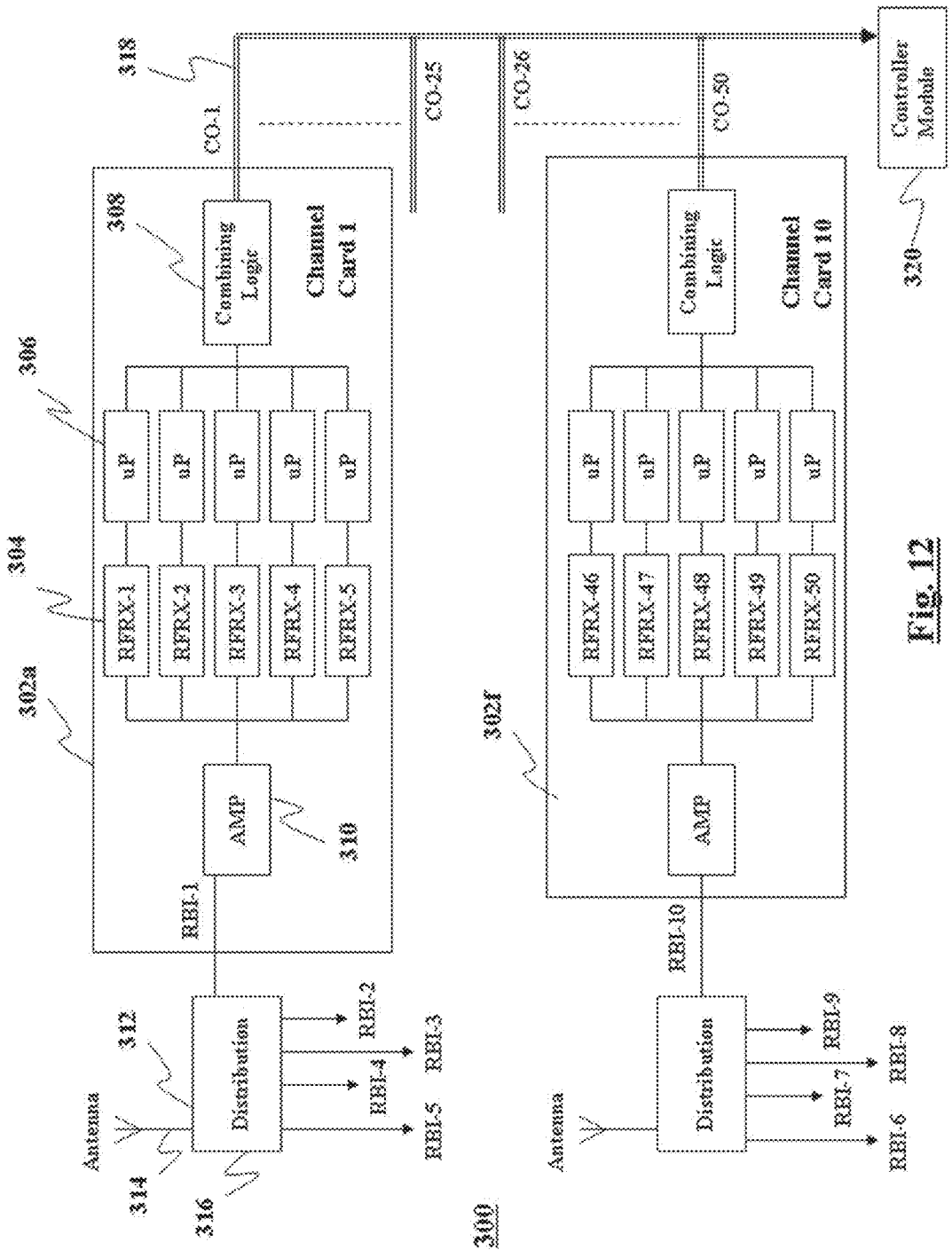
FIG. 12 is a block diagram illustration of one embodiment of a remote receiver/data collector.
Figure 13:
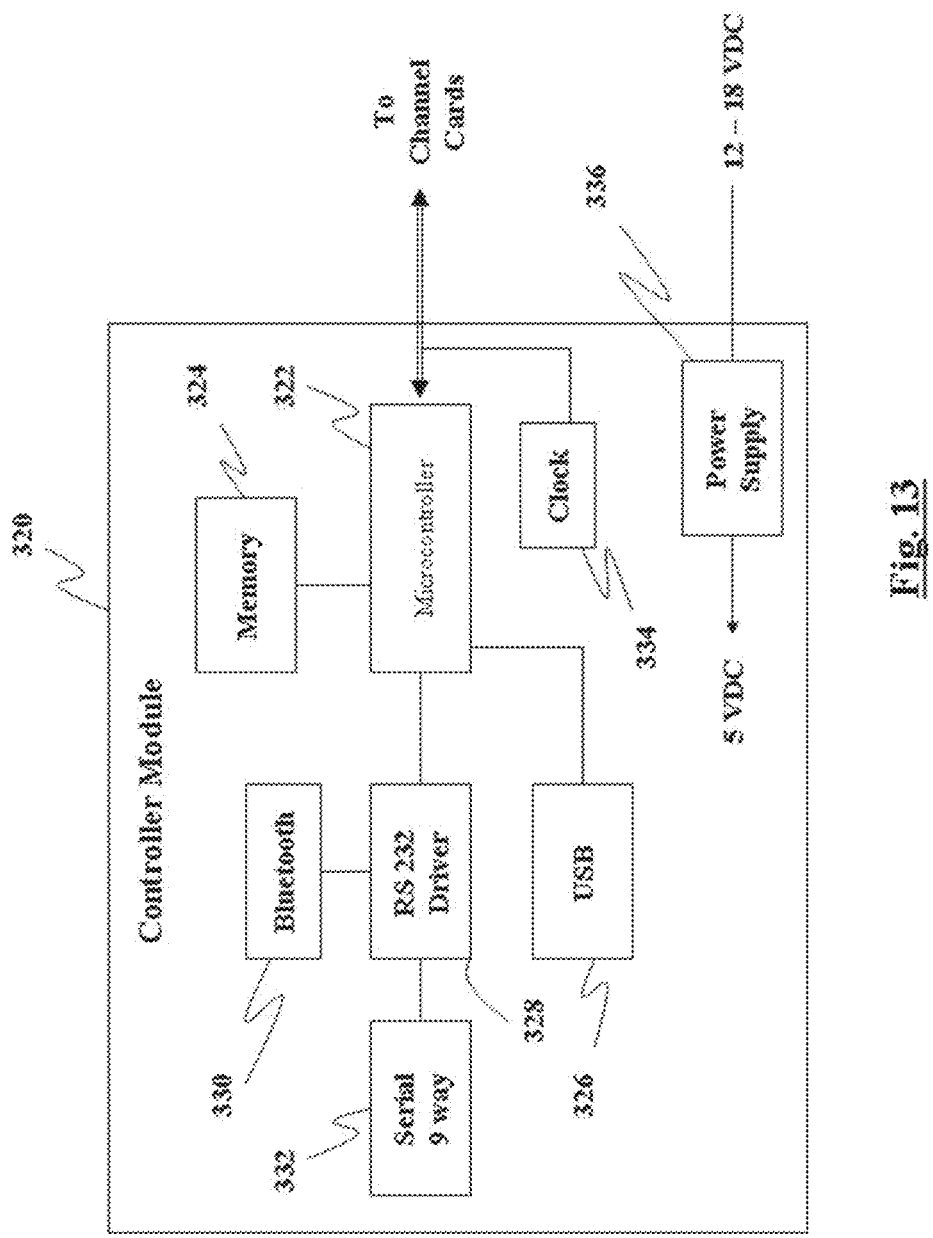
FIG. 13 is a block diagram illustration of one embodiment of a controller module for a remote receiver/data collector.

Presented next are the modes of operation for transmitter (200) when configured as a Multiple Mode AMR device also referred to as a Universal Meter Transmitter (UMT). For such configurations, FIG. 11 depicts one exemplary preferred embodiment. The components of transmitter (200) include processor (202) electrically associated a RF transmitter (205) and either a low power transceiver (205b) or simply a receiver (not a transceiver) with transmitter (200) being electrically associated with a utility meter (10) via a wired or wireless communication connection as described above depending on the desired implementation. In addition, such a multiple mode AMR device is configured to track the passage of time.

Transmitter (200) is configured to transmit a data signal over a range of output power levels depending on the transmitter mode selected. However, for the preferred embodiment, transmitter (200) will be configured with a maximum power level (e.g. 1 watt) that the transmitted signal is not to exceed regardless of the transmitter mode selected.

Transmit Mode I

Drive-by/Walk-by Using Time Tracking Function

As noted above, transmitter (200) is powered by an exhaustible power source. Consequently, minimizing power consumption is one goal of the present invention. Thus, to assist in minimizing power consumption, for the preferred embodiment, transmitter (200) does not transmit a data-signal continuously. Please note that any transmitter that has periods of time when the transmitter is not transmitting (i.e. has an on/off cycle) falls within the definition of not transmitting a data-signal continuously. For the preferred embodiment, transmitter (200) is placed in a sleep-mode during predefined periods. While transmitter (200) does include a receiver for receiving a transmitted data signal, for this mode of operation it is assumed that the utility personnel walking by or driving by the utility meter (10) does not have the capability to transmit a wakeup signal. Consequently, there will be no wakeup signal to turn on transmitter (200) and the receiver remains inactive to conserve power. To overcome the "no wakeup signal" problem, processor (202) is configured to track the passage of time.

Processor (202) may track the passage of time using any number of well-known methods and technologies for tracking time. For the preferred embodiment, processor (202) is operatively connected to a time keeping circuit that generates time-data. Such time keeping circuit may be a device external to processor (202) or internal to processor (202). Alternatively, processor (202) may track the passage of time by executing a time keeping program. For this embodiment of the present invention, processor (202) tracks the day of the week and the time of day (hour, minute, and second). Next, processor (202) accesses transmitter-schedule-data stored in a memory associated with processor (202) for determining when to transmit a data-signal. Examples of transmitter-schedule-data include a transmit start time, stop time, and transmit sequence. Notably, the transmit start time and transmit stop time may represent a "continuous" operation mode (e.g. transmit a signal every hour all the time—start time and stop time are the same) although such is not preferred. Such transmitter-schedule-data may be stored in a table or simply included in the programming code (perhaps in ".h" files for C programming language) for the transmitter. Notably, a transmitter-schedule-data set may share values with outer modes. For example, the transmit start time and stop time values may be used by more than one mode.

Using such time-data and transmitter-schedule-data, the transmitter can be placed in a low power consumption mode such as a sleep-mode until processor (202) determines that a transmission session should begin. In addition, using such time-data, processor (202) can configure the transmitter to implement at least one of a plurality of possible transmitter sequences. One of ordinary skill in the art will appreciated that a "sleep-mode" is simply a lower power mode used to conserve power consumption.

For the present embodiment of the invention, RF transmitter (205) is initially placed in a sleep-mode. While in sleep-mode, RF transmitter (205) consumes minimal power (or no power). Processor (202) tracks the passage of time by generating or accessing time-data. Next, processor (202) accesses the appropriate transmitter-schedule-data and compares the time-data to the transmitter-schedule-data. Examples of transmitter-schedule-data include a time period (such as 4:30 pm to 5:30 pm). When processor (202) determines that a transmission session should begin, processor (202) places transmitter (205) in a transmit-enable mode. The duration (length in time) of the transmit-enable mode may be a preset constant value or a user programmable value and it may simply be a continuous time period used 24/7 or 24/5 days a week (perhaps weekend the transmitter shuts down (sleep mode)). While in transmit-enable mode, RF transmitter (205) may transmit a data-signal continuously (i.e. the transmitter is always enabled and can transmit a data signal at any time), and, to further conserve power, may transmit a data-signal according to a predefined transmit sequence. Restated, transmitter may be configured to transmit a data-signal for a predefined transmit-on time and then stop transmitting for a predefined transmit-off time. Such a sequence would repeat for the duration of the transmit-enable period (which may be continuous 24/7 or 24/5 yet still represent a "non-continuous" transmitter mode). For a 24/5 mode (24 hours a day, 5 days a week), the start time could be Monday, 12:00 am and stop time could be Friday, "11:59 pm" (for example).

Additionally, transmitter sequences may be tailored for a particular situation. For example, a walk-by transmit mode could be a transmitter sequence specifically selected for relatively slow moving persons walking through a neighborhood with remote meter reading equipment. For such situations, longer transmit-off times are desirable. Similarly, a drive-by transmit mode could be a transmitter sequence specifically selected for situations where the remote meter reading equipment will be attached to a moving vehicle. Such a transmitter sequence could be based on the speed limit in the surrounding area or a generic on-off sequence.

By way of example, consider the following transmission schedule. Processor (202) is programmed to enable the transmitter for two hours on Mondays, Wednesdays, and Fridays, beginning at 4:00 pm. Processor (202) determines that it is 4:00 pm on a Monday and processor (202) places RF transmitter (205) in transmit-enable mode. Next, processor (202) accesses transmission sequence data stored in memory (201) and determines the transmission sequence to be used. For this example, the transmission sequence is as follows, transmit data-signal for six seconds and stop transmitting data-signal for 6 seconds. Processor (202) sends the corresponding configuration commands to RF transmitter (205) over transmitter communication bus (210). RF transmitter (205) begins transmitting the data-signal for six seconds followed by a six second period without transmitting the data-signal. Processor (202) continues to track the passage of time until processor (202) determines that the current time is 6:00 pm. Next, processor (202) places the RF transmitter (205) back into sleep-mode.

In addition to saving power by limiting transmitter on times, the walk-by/drive-by configuration may be configured to transmit power at a reduced power level. In a walk-by/drive-by system, the utility meter personnel will, by definition, walk-by or drive-by relatively close to the transmitter (200). As a result, the power level of the transmitter signal can be set accordingly.

As previously noted, processor (202) may be programmed to reconfigure RF transmitter (205) to transmit over a range of power levels. For the preferred embodiment of the invention, a default Walk-by/Drive-by Power Level (WDPL) is stored in a memory associated with processor (202). For example, a default WDPL value may be 80 mW. When processor (202) determines a data signal is to be transmitted, processor (202) retrieves the WDPL value and configures RF transmitter (205) to transmit a data signal at the WDPL power level.

The WDPL value is preferably user programmable for individual units as some convenient walk-by/drive-by distances may be unusually long requiring transmitter (200) to transmit at higher power levels. Such versatility allows a default WDPL that is suitable for most installations while allowing higher WDPL values for installations where longer transmission distances are required.

Exemplary transmitter sequences may include power level, a time period, and a transmitter sequence. For example, one set of transmitter sequence values includes a WDPL value of 1 mW, time period of 4:30 pm to 5:30 pm, a transmit period of 4s, a transmit time of 3 ms. For such transmitter sequence values, the transmitter is placed in transmit-enable mode at 4:30 pm and placed back into a sleep mode at 5:30 pm. When in transmit-enable mode, the processor sets the transmitter power level to 1 mW and transmits a 3 ms data-signal every 4 seconds.

A second set of transmitter sequence values includes a WDPL value of 500 mW, time period of 4:30 pm to 5:30 pm, a transmit period of 30s, a transmit time of 3 ms. For this example, the transmitter is placed in transmit-enable mode at 4:30 pm and placed back into a sleep mode at 5:30 pm. When in transmit-enable mode, the processor sets the transmitter power level to 500 mW and transmits a 3 ms data-signal every 30 seconds.

As the examples illustrate, when power levels are increased, the time between transmissions can be decreased as the transmitted data-signal has a longer range which means a walking person will likely be in range of such a signal for a longer period of time. Further, one of ordinary skill in the art of programming will appreciated that "placing the transmitter in transmit-enable mode" is simply a way of saying a transmitter session is appropriate and such may be accomplished by any number of programming techniques. One could contend that the transmitter is always "enabled" and simply activated when needed.

Transmit Mode II

Drive-by/Walk-by Using Receiver Function

Presented next is an alternative walk-by/Drive-by configuration that uses a receiver to listen for a wakeup signal. For such a configuration, processor (202) is configured to use receiver (205b) to listen for a wakeup signal. The utility representative uses interrogation equipment that transmits a simple wakeup signal. When such utility representative comes within range of a utility meter (as he walks or drives by the utility meter), processor (202) detects the wakeup signal and starts transmitting a data signal according to a walk-by or drive-by transmit sequence as described above. The transmitter wakeup signal may be a generic signal that wakes up a plurality of meters and/or a meter specific signal that only wakes up the ARM enabled meter(s) of interest (i.e. only one meter or group of meters).

It should be appreciated that having a receiver powered continuously also consumes power. Consequently, transmit mode II may also use the time tracking function and only active the receiver according to a predefined schedule.

Transmit Mode III

Fixed Network Using Time Tracking Function

Presented now is Transmit Mode III which is a fixed network mode of operation for transmitter (200). In the fixed network mode, transmitter (200) transmits a data signal that is received by a gateway/repeater/collector which in turns transmits the data over a wired or wireless communication link to a remote location (such as the utility company). As before, to minimize power consumption, transmitter (200) does not transmit a data-signal "continuously". Instead, transmitter (200) is placed in a sleep-mode and transmits a data signal according to a predefined transmission schedule or upon remote command. An Example of non-continuous operation (for Fixed Network mode) would be to wake up every 15 minutes and transmit a data signal and then go back to "sleep" (or enter a lower power consumption state) and do this 24/7 (24 hours a day, 7 days a week). Another example of "non-continuous" for a fixed network mode is to configure the transmitter to respond to a wakeup signal so that the associated meter can be read on demand (for example).

For such a configuration, processor (202) tracks the passage of time. When the processor determines that it is time to transmit a data signal, processor (202) retrieves the necessary information to configure RF transmitter (205), configures RF transmitter (205) according to Transmit Mode III criteria and transmits a data signal. As previously noted, processor (202) may be programmed to reconfigure RF transmitter (205) to transmit over a range of power levels. For the preferred embodiment of the invention, a default (e.g. 250 mW) Fixed Network Power Level (FNPL) is stored in a memory associated with processor (202). However, such a FNPL value may be changed as required for a particular installation. Such versatility allows for a default FNPL that is suitable for most installations while allowing higher FNPL values for installations where longer transmission distances are required. Similarly, the FNPL level may be set to a value below the default value for some installations.

Additionally, the above described Fixed Network Mode may also use receiver (205b) to receive a data signal from a remote location. For this embodiment, processor (202) is configured to use transceiver/receiver (205b) to listen for a data signal. To conserve power, the receiver is preferably activated according to a receiver schedule. When processor (202) determines that it is time to active transceiver/receiver (205b), the receiver is turned on and processor (202) listens for a properly formatted R-data-signal. Such is one example of a non-continuous mode.

UMT Receiver Function

For one embodiment the Universal Meter Transmitter (UMT) (200) comprises a receiver. The multiple mode AMR device (UMT) receiver function may be implemented in several configurations. In the simple wake up configuration, receiver (205b) is a simple receiver that listens for a carrier signal at a predefined frequency. For this configuration, the wake up signal will wake up all UMTS in range of the transmitted signal. In yet another configuration, the receiver (205b) is capable of receiving a complex data signal containing instructions to be implemented by processor (200). While the receiver may be configured to operate continuously, receiver (205b) is not in continuous operation but operates according to a receiver schedule to conserve power. The receiver schedules for each ARM device is known by the utility company and if the utility company needs to contact a particular AMR device installation, a data signal is transmitted at the appropriate time. Such data signal is intercepted by transceiver/receiver (205b) and directed to processor (202). Preferably, the utility company's transmitted data signal comprises a unique transmitter identifier so that transmitter (200) may ignore signals that do not contain the appropriate transmitter identifier.

The utility company data signal may simply be a request for transmitter (200) to retransmit meter data. The utility company's data signal may also contain information for updating configuration criteria stored in a memory associated with transmitter (200). For example, the utility company's data signal may contain information to change the WDPL, the FNPL, the drive-by/walk-by transmitter schedule, the receiver schedule, the system clock value, as well as other values.

By way of example, assume a receiver sequence includes the following values: time period, receiver on time, receiver off time. For one embodiment, the time period is 5:00 am to 5:00 pm, and 12:15 am to 1:15 am, receiver on time is 2 seconds and the receiver off time is 8 seconds. For this example, a receiver X is placed in receiver-enable mode from 12:15 am to 1:15 am and 5:00 am to 5:00 pm. When in receiver-enable mode, the receiver X listens for a properly formatted R-data-signal for 2 seconds out of 10 seconds. When a remote transmitter wishes to communicate with receiver X, the transmitter transmits a properly formatted R-data-signal for 10 seconds. IF receiver X is in receiver-enable mode, receiver X will receive and process the R-data-signal and perform the requested tasks. As another example, the receiver may simply be programmed to turn on and become "active" every hour (on the hour), stay active for 15 minutes and listen for 5 seconds and sleep for 10 seconds while active.

Fly-By Mode

As noted previously, a "fly-by" mode is configured to minimize environmental factors that can have a dramatic effect on the propagation of RF signals. Such environmental factors include: (a) Scattering; (b) Absorption/Reflection; (c) Diffraction; and (d) Distance. For a fixed (non-moving) Meter Transmitter the above RF environmental propagation issues are basically a function of remote receiver antenna height and distance relative to the meter transmitter. Notably, the best wireless propagation path between the meter transmitter and a remote receiver is typically a line-of-sight path that is a short as possible. A line-of-sight path is exactly what it sounds like . . . a "straight path" where there is nothing but air between the receiver and the UMT.

Figure 14:
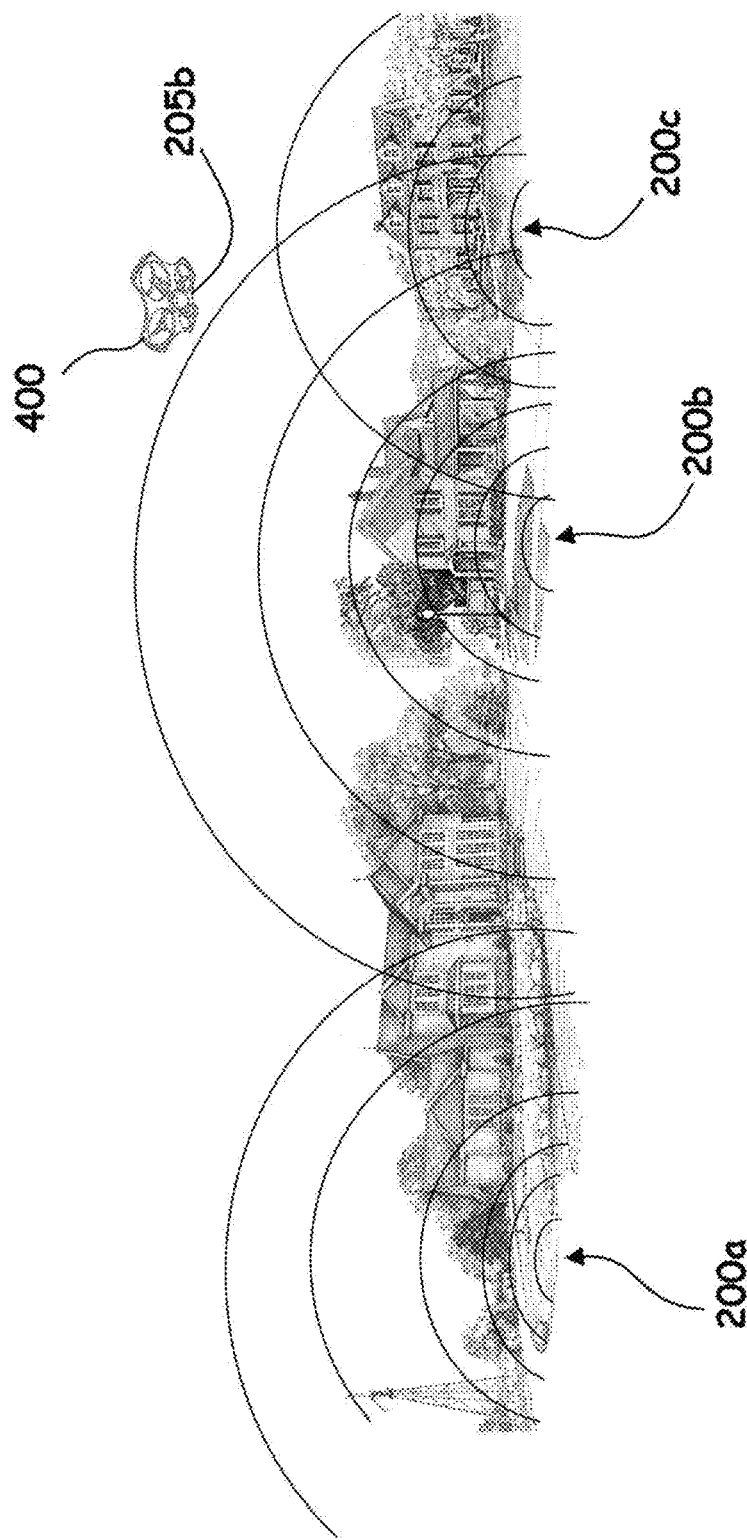
FIG. 14 is a side elevational view of an airborne device associated with a remote receiver hovering over a graphic illustration of a neighborhood.

Referring to FIG. 14, generally speaking, a RF signal propagates through air similar to the way ripples propagate through water. Drop a rock in water and a circular wave is generated that propagates away from the point of impact via increasingly larger circles. Notably, for water meters, the UMTS are typically installed in a water meter pit below ground level. Such means a significant amount of the RF Signal is directed straight upwards as depicted in FIG. 14 for transmitters 200a, 200b, and 200c. Consequently, the most cost effective system would position the remote receiver (205b) straight above each UMT (200). Prior art systems can use a walk-by mode where a remote receiver is associated with a person that carries the remote receiver up to the UMT but such a system is expensive as there may be 100,000 meters to read. The disclosed technology addresses such issues by using a "fly-by" configuration.

For the fly-by system, an airborne device (400) is associated with a remote receiver (205b). One embodiment of a suitable airborne device (400) is a drone as depicted in FIG. 14. One alternative system would be a hybrid drone/lighter-than-air system such as a blimp controlled by drone technology. The blimp would do the "heavy lifting" and the drone technology controls the motion of such a remote receiver. Suitable drone and associated control technology is well known in the art and a detailed description thereof is not necessary for providing an enabling disclosure. That said, one example of suitable drone technology is disclosed in US Patent Application 20130325217, filed on 2013 Dec. 5 by Seydoux et al. and such reference is incorporated herein by this reference for all that it discloses for all purposes. Some modifications to such drone technology will be disclosed.

Drone Tower

Figure 15:
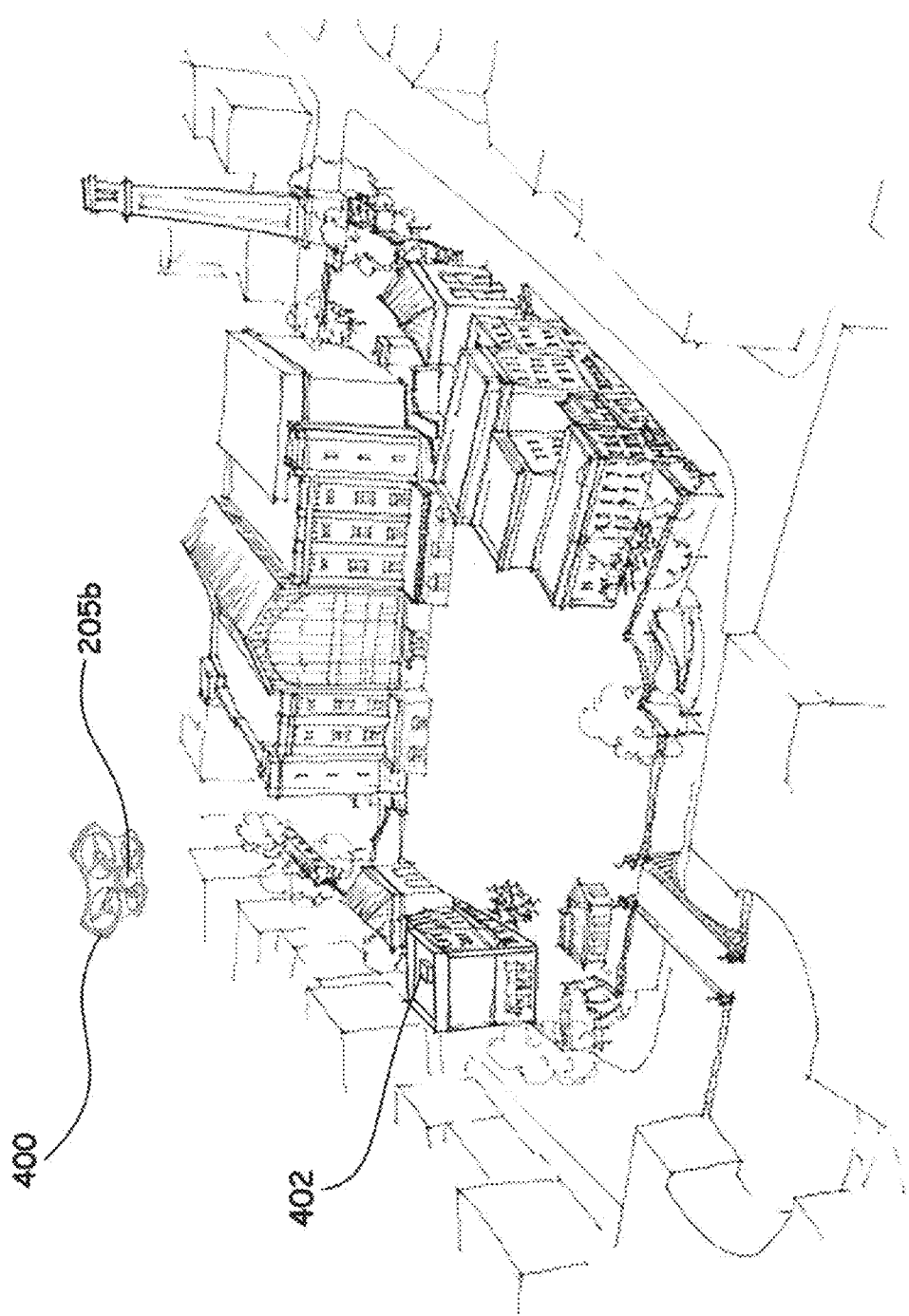
FIG. 15 is a side perspective view of an airborne device associated with a remote receiver defining a drone tower.

For one fly-by mode, airborne device (400) is simply a drone that flies straight up as depicted in FIG. 15 and is referred to as a Drown Tower™. For this embodiment, a remote receiver (205b) is associated with drone (400). Drone (400) is associated with a GPS receiver (or similar technology) and is able to determine its location and preferably its height and the presence of nearby objects. Drone (400) is programmed with the GPS coordinates of at least one docking station (402, FIG. 15). Notably, the "GPS" data could be any type of data that can be used to determine location such as positioning data derived from cell phone tower transmitters or transmitters associated with a plurality of docking station. The docking station (402) could be located at or below ground lever but preferably it is elevated or positioned on top of a building. When activated, for one mode, such drone (400) simply activates and flies straight up (basically) to a predefined height and remains there until (a) the remote receiver (205b) signals all relevant data has been collected, (b) a predefined time lapses, or (c) some environmental condition warrants return (low battery, windy, rain, etc.). Notably, such drone (400) could also fly a predefined pattern such as a circular or rectangular pattern.

When the drone determines it is time to return to a docking station (402), for one embodiment, it transmits a signal to the docking station to prepare to receive the drone (400). Alternatively, the docking station could track time and determine when it is to prepare to receive drone (400) and perhaps signal the drone to return. For one embodiment, the docking station (402) transmits a docking signal. Such docking signal would preferably be a narrow band signal, such as a modulated laser beam, transmitted straight up from the position where the drone is to dock. The drone (400) is further configured with a docking signal sensor. The drone (400) would fly to the docking station's GPS coordinates and detect and use the docking signal to fine tune its alignment with the docking station as it returns to such docking station. The docking signal would ideally be modulated (or similar method) in a way detectable by drone (400) to minimize the risk of drone (400) following an invalid signal. Alternatively, the drone could simply be manually controlled by a user. The docking station would further automatically supply power to the drone when docked to replenish the drone's power source.

Mobile Drone Tower

For one alternative embodiment, the docking station (402) is associated with a vehicle such as the bed of a truck. For this embodiment, the drone (400) is preferably driven to a predefined spot and deployed in a drone tower mode. As noted above, such drone could fly a pattern that would typically be predefined. Such drone could be configured to fly a predefined route automatically or such drone could be controlled manually.

Figure 16:
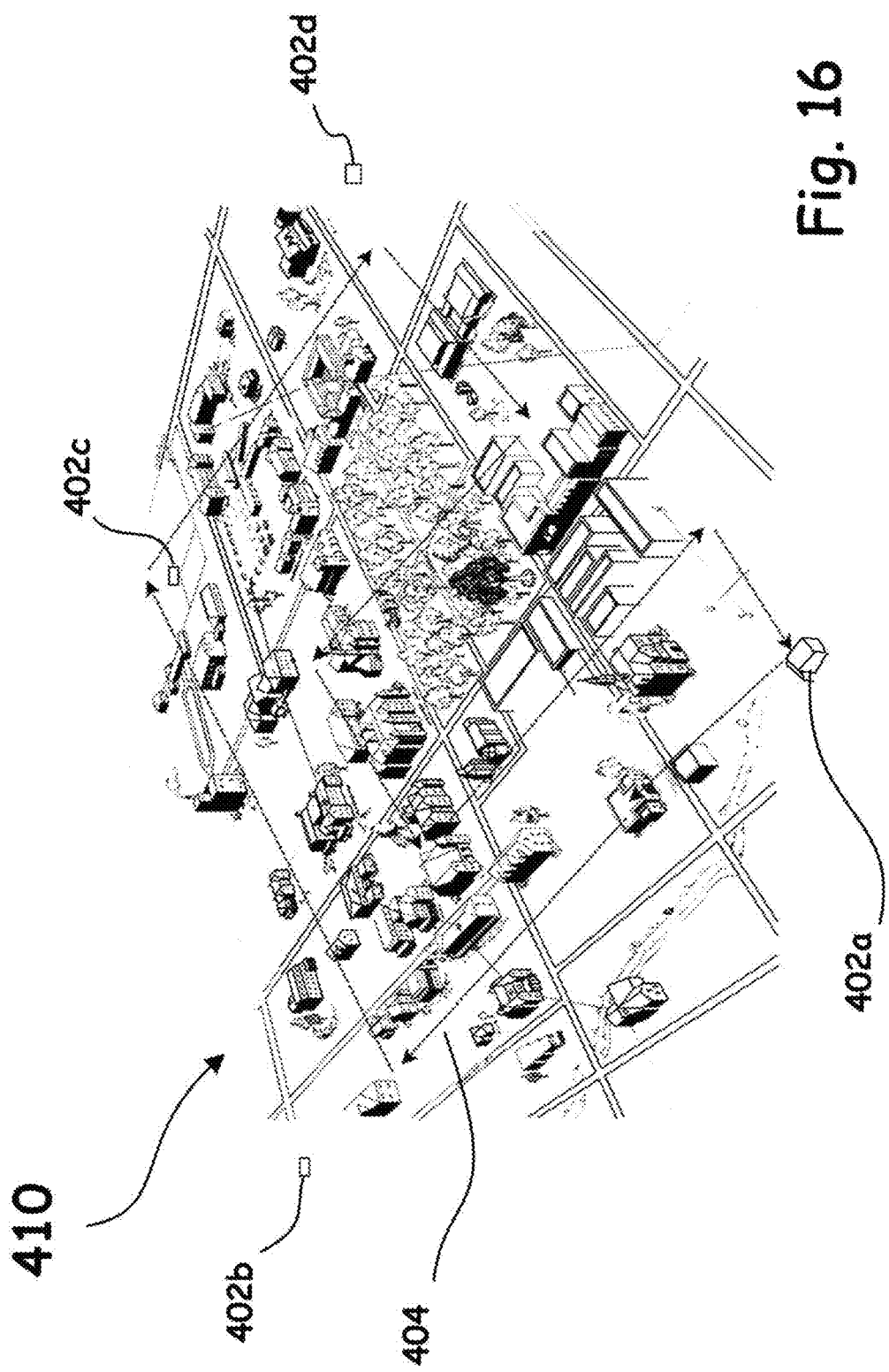
FIG. 16 is an elevated perspective view of an airborne device's fly-by route in a grid pattern.

Referring now to FIG. 16, another alternative embodiment of a fly-by system is presented. For this embodiment the drone would be configured to automatically follow a pattern (404) above a measurement area (410). As before, the drone is docked at a docking station (402) such as (402a). When activated, the drone ascends to a predefined height and flies a predefine pattern (404) such as a grid pattern. For one embodiment a plurality of docking stations (402) are positioned throughout the measurement area (410). Such docking stations may transmit a docking station signal (integrated into or separate from a docking signal) that the drone may use to determine its position. Such docking station signal would preferably be an RF signal. Notably, the drone could be configured to dock with any of the docking stations as needed and the system could comprise a plurality of drones. The docking stations (402) may be configured to receive and support more than one drone.

As before, the UMT would be configured with a drone transmitter-schedule-data specific to the drone parameters or the "fly-by" mode may simply use the parameters for a previously defined mode such as fixed network and walk-by/drive-by modes. That said, to take full advantage of the fly-by mode the UMT should be specifically configured with fly-by parameters.

Calibration

One method of taking full advantage of the fly-by mode is to calibrate at least one of the UMTS and airborne devices/drones (400) within the system. A drone is "calibrated" by configuring its navigation-path (404) to come within range of substantially all UMTS. For such embodiment, the UMTS are configured to transmit a data signal at a relatively low power (selected by the user). The position of all UMTS are either stored in the receiver associated with the drone and/or the drone itself. The drone would fly a "grid pattern" as noted previously and make deviations as needed to collect data from UMTS slightly off the pattern. The drone would also preferably be configured to store meter specific or zone specific height and speed parameters. In areas with a large population of UMTS the drone would be programmed to slow down or hover until the receiver/drone determines all data (or a predefined percentage) in a zone has been collected.

Alternatively, the UMTS would be calibrated. For this embodiment the UMT would transmit a data signal at a predefined minimum value. The drone would be configured to transmit a "data received" signal when it detects the UMT data signal. If the UMT does not receive a data-received signal within a predefined period of time the UMT increases the power level of the transmitted signal a predefined amount and listens for a data-received signal. If a data-received signal is detected, the UMT remembers the power level used and goes back into a low power consumption mode. If a UMT does not detect a data-received signal, the UMT increases the power level of its transmitted data-signal and retransmits its data-signal. The process repeats until the data-received signal is detected, a maximum power level is reached, or a predefined amount of time passes.

Of course a combination of Drone calibration and UMT calibration can be used. For such embodiment, the UMT includes power level data in the data transmitted to the drone. Restated, if the UMT must transmit a data signal at 100 mW to achieve a successful communication session, such value is included in the data stream transmitted to the drone. The drone is programmed with a max-UMT-PL value (PL-power level) and if the UMT is required to transmit at a power level that exceeds the max-UMT-PL value (as in our example above) either the drone (400) automatically modifies its flight pattern (404) to move closer (or perhaps achieve a better line-of-sight angle) to the relevant UMT or a user makes manual adjustments to the flight pattern (404) so that the next time the UMT enters a transmission session a lower transmit power level will result in a successful communication session. For example, suppose a UMT must transmit at a power level (PL) of 250 mW to achieve a successful communication session with drone (400) and suppose the max-UMT-PL value is (100 mW). The UMT transmit power level is over twice what is desired. The drone makes adjustments to its flight pattern (404) so that its flight path either results in a better ling-of-sight propagation path and/or the drone flight path comes closer to the UMT. The system can be programmed so that such functions are continuously monitored so the system is always self-calibrating. Alternatively, such calibrations can be performed periodically.

Notably, a UMT may be programmed to always start at the lowest power level setting to transmit a signal or it may remember the power level last used that resulted in successful communication session with the drone (400) and start transmitting at such power level.

Similarly, the drone may also detect (and record if necessary) the power level of the received data signal for a particular UMT. The drone is ideally programmed with a max-UMT-received-PL value. Such max-UMT-received-PL value is simply the predefined value for which the system user wishes no UMT to exceed (to conserve battery life). If the measured received power level value of a data signal exceeds the predefined max-UMT-received-PL value, the drone notifies the UMT of a high received power level condition and the UMT reduces the power level of its transmitted signal one (or some predefined number) level for the next communication session. Using such method, eventually the system will self-calibrate to the desired optimum values for all UMTS (i.e. individual UMT transmit power levels and drone flight path will be optimized). Notably a user can tweak the max-UMT-PL value and the max-UMT-received-PL value to further maximize the system.

Real-Time/Near Real-Time Data

Initially, an understanding of "real time data" or near "real time data" and old data should be considered. Real-time data is data that has been at least recently retrieved from a data source so that the retrieved data value is the same as, or very close to, the value(s) currently associated with the data source (e.g. water meter). For example, suppose one reads a water meter register and it provides a reading of 100 units, and 5 minutes later the reading on the water meter register is still 100 units. For such a situation the 5-minute old data is still "real time data" as it still represents the actual reading on the meter register.

One of ordinary skill in the art will realize that what qualifies as "real time data" is likely dependent on the normal rate of change of the data and the interval such data is normally recorded. For example, for a system where the data changes substantially every 2 seconds and is normally monitored every 0.5 seconds, 10 second old data is not likely considered to be real time data nor near real time data (although 0.01 second old data would likely be considered at least near real time data and 0.001 second old data would likely be considered real time data). In contrast, data that is 10 days old for a system where the data does not change substantially every month and is normally monitored every two months is likely considered real-time data.

For the purposes of metering the consumption of water via water meters, such consumption is traditionally billed every month (30 days). Further, water consumption typically does not substantially change over a 1-hour period. Thus, 1-hour old data is considered at least "near real time data" and 15-minute old data would likely be considered real-time data.

By optimizing the UMT transmitter power levels as disclosed above, and using a plurality of drone (400) devices, the system can achieve real-time or near-real time data with the UMT operating at power levels consistent with walk-by systems (the best of both worlds). For such a configuration a number of drones are used in either drone tower mode or fly-by mode (or both). Preferably, the drones are configured so that a drone is within communication range of each of a plurality of UMTS at intervals necessary to achieve real time or near real time data.

Notably, when a communication session between a UMT and Drone is successful, one of the functions performed is to synchronize the UMT clock with the drone clock. Further, the drones are ideally in communication with each other and their clocks are synchronized with each other and preferably a master clock (perhaps at a user site).

For such configuration, exemplary UMTS fly-by parameters include a transmitter power level value and a transmitter mode value. The transmitter mode values would contain the parameters the UMT's processing device uses to configure the transmitter such as the transmitter-active duration time, how to configure the UMT data signal, and the transmission sequence (i.e. Transmit for 10 ms and do not transmit for 5 seconds and repeat). Notably such "schedule" values can be in a table or simply incorporated into various programming routines or algorithms that are executed (or not) depending on the desired UMT performance.

Exemplarily transmitter modes would be to turn on every 30 minutes, read the water meter, enter active transmit mode for 5-minutes, and transmit a data signal according to predefined parameters (e.g. a 10 ms data signal every 5 seconds). Thus, for every 30 minutes a UMT wakes up, reads the water meter, enters transmitter active mode, transmits a data signal burst (which takes about 10 ms) and then does not transmit for the remainder of the 5 seconds, and then repeats such sequence for 5 minutes after which the UMT goes back into sleep mode.

Ideally the receiver is active during some portion of the active transmission session to listen for data signals transmitted by the drone. Alternatively, the receiver may be active during times the transmitters are not in active transmit mode perhaps according to its own schedule such as to wake up every 10 minutes and listen for 2 minutes. Such would enhance the ability for the system to deliver real time data as a remote receiver can establish a communication session every 10 minutes if desired. Of course the above values are selected for use in a model AMR water meter system and such values can be changed to accommodate data transfers in any type of system.

Remote Transceiver

Figure 17:
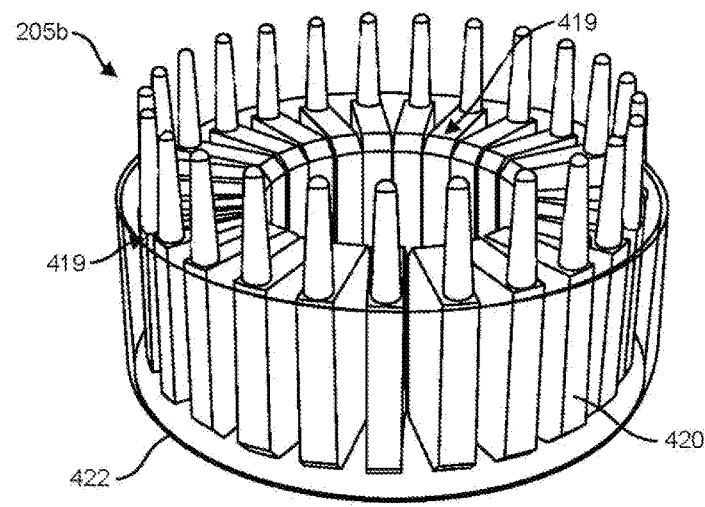
FIG. 17 is a side perspective view of a remote receiver/collector.
Figure 18:
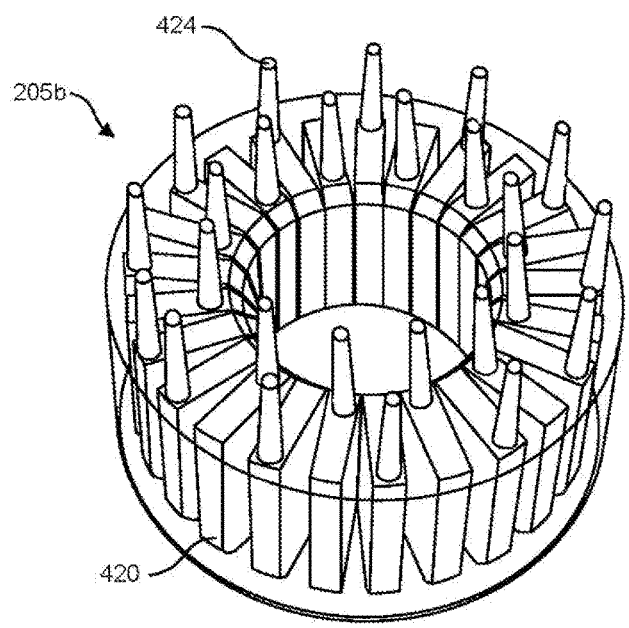
FIG. 18 is a side perspective view of one alternative embodiment of a remote receiver/collector configuration.

Embodiments of the remote transceiver (205b) hardware are now considered. One configuration of a remote receiver (transceiver) (205b) is depicted in FIG. 17 and FIG. 18 comprising a plurality of receiver modules (420) configured in a circular pattern thereby defining an inner receiver perimeter (418) and an outer receiver perimeter (419). For the current embodiment each receiver module (420) has one receiver board. Thus, if one wishes to listen on 25 channels at one time one needs 25 receiver modules (420). Each receiver module (420) is electrically and mechanically associated with a receiver controller (422) at a first end with an antenna (424) defined at the opposing second end. The receiver module housing defines a rectangular shape similar to a cigarette pack.

In FIG. 18 the receiver modules (420) are shown configured so that every other receiver module (420) is mechanically and electrically associated with the receiver-controller (422) so that the receiver module's (420) antenna (424) is disposed close to the outer perimeter (419) of the module circle with the remaining receiver modules (420) antennas (424) disposed close to the inner perimeter (418) of the receiver circle.

As depicted in FIG. 17 and FIG. 18, each receiver module is programmed to listen to a different channel giving the remote receiver (205b) a total of 25 channels. Preferably, the system is configured so that any receiver module (420) can be programed to listen on any of such 25 channels (or perhaps a new channel outside the normal 25 channels). Further, if one receiver module fails or is removed, one or more of the other receiver modules would ideally be automatically or manually programmed to take over the duties of the removed or failed receiver module (i.e. listen on its channel half the time and on the failed module's channel half the time or some similar arrangement).

For one embodiment of a remote receiver (205b), at least one receiver module (420) includes its own controller board and power source so that it can be disconnected from the remote receiver (205b) system and carried like a hand-held radio. Such a configuration allows at least one receiver module to be remove from the remote receiver (205b) and carried as if being used in a walk-by mode. For one embodiment, the receiver module would have its own transmitter and/or at least one receiver module would further comprise at least one transmitter. The receiver controller would communicate with each receiver module and transfer the module's data to a local memory and/or a remote device via the receiver-controller's own communication technology (e.g. cell phone transmitter, propitiatory transmitter, cellular modem, etc.).

Based on the above teachings the following exemplary system is presented. The exemplary automatic meter reading (AMR) system is configured to transfer data from a data source (e.g. utility meter) to a data user (e.g. utility company). A plurality of data source modules (utility meters with AMR transmitter) are disposed within/throughout a predefine area covered by a utility company. Each of utility meters comprise an AMR transmitter module comprising (i) a power source configured for supplying power to at least the transmitter module and (ii) a processing device (controller) electrically associated with at least one of one of integral and external memory. The processing device is further electrically associated with communication circuitry comprising a programmable transmitter electrically associated with an antenna. Such communication circuitry preferably includes a receiver as well.

At least one airborne remote receiver is configured to maneuver within/throughout the utility's predefined area to position the remote receiver within communication range with each of the plurality of utility meters. The remote receiver and the utility meters track the passage of time and the time data for each utility meter is ideally synchronized with the remote receiver time data. The processing device is configured to transmit a meter data signal according to a predefined module schedule which should occur when the remote receiver is within range as defined above.

The system is preferably self-calibrating. For such a configuration, the utility meter includes power level data with the transmitted meter-data-signal. The remote receiver uses such power level data to determine if a particular meter is using too high a power level to transmit its signal. Notably, the receiver is likely to receive more than one signal from each utility meter as the receiver will be in range of a utility meter for a certain time span and there will likely be receiver positions that are closer to a particular meter over time. Such data variations are taken into consideration during the calibration session.

If so the remote receiver preferably automatically determines if and how to alter his flight path to allow the utility meter to lower the power level of its transmitted signal. Once the flight path has been modified the remote receiver request the relevant utility meter to recalibrate its transmitted signal power level value as described above.

While the present subject matter has been described in detail with respect to specific embodiments thereof, it will be appreciated that those skilled in the art, upon attaining an understanding of the foregoing may readily adapt the present technology for alterations to, variations of, and equivalents to such embodiments. Accordingly, the scope of the present disclosure is by way of example rather than by way of limitation, and the subject disclosure does not preclude inclusion of such modifications, variations, and/or additions to the present subject matter as would be readily apparent to one of ordinary skill in the art.

What is claimed is:

1. An automatic meter reading (AMR) system configured to transfer data from a data source to a data user, said AMR system comprising:
   a plurality of data source modules disposed within a predefined area, each of said plurality of data source modules comprising (i) a power source configured for supplying power to said data source module and (ii) a processing device electrically associated with at least one of one of integral and external memory, said processing device further electrically associated with communication circuitry comprising a programmable transmitter electrically associate with an antenna;

an airborne remote receiver configured to maneuver within a predefined area to position said remote receiver within communication range with each of said plurality of data source modules;

wherein said remote receiver and each of said plurality of data source modules track the passage of time and wherein the time data for each of said plurality of data source modules is synchronized with the remote receiver time data; and wherein said processing device is configured to transmit a module-data-signal according to a predefined module schedule.

2. An AMR system as in claim 1, wherein at least one of said plurality of data source modules is a universal meter transmitter (UMT) electrically associated with a utility meter, said power source is a battery and said airborne remote receiver comprises a drone.

3. An AMR system as in claim 2, wherein said UMT is configured to operate in any one of a plurality of modes without hardware modification including at least one of a drive-by mode, a fixed network mode and a fly-by mode.

4. An AMR system as in claim 3, wherein said UMT can transmit a UMT module-data-signal at a plurality of power levels and where the said UMT module-data-signal includes transmitter power level data relatable to the power level at which the UMT transmitted said UMT module-data-signal.

5. An AMR system as in claim 4, wherein said remote receiver uses said power level data to automatically modify the remote receiver's flight path through said predefined area to lower the UMT transmitter power level required for said UMT to communicate with said remote receiver.

6. An AMR system as in claim 1, further comprising a plurality of airborne remote receivers and wherein said predefined module schedule defines a real-time-data transmit window value and wherein each of said plurality of data source modules are configured to transmit said module-data-signal at least once during said real-time-data transmit window and wherein said plurality of airborne remote receivers are distributed throughout said predefined area to collectively collect real-time-data from a predefined percentage of said plurality of data source modules.

7. An AMR system as in claim 6, wherein at least one of said plurality of airborne remote receivers is deployed in a drone tower mode.

8. An AMR system as in claim 7, wherein at least one of said plurality of airborne remote receivers is deployed in a mobile drone tower mode.

9. An AMR system as in claim 1, where said airborne remote receiver comprises a plurality of receiver modules electrically associated with a receiver controller wherein each receiver module defines a programmable receiver unit configured to listen on one channel.

10. An AMR system as in claim 9, where said plurality of receiver modules defines at least 5 receiver modules and wherein each receiver module is programmed to listen to a different channel and wherein said receiver controller is configured to reprogram a functional receiver module to listen on a second channel to compensate for a failed receiver module.

11. An automatic meter reading (AMR) system configured to transfer data from a utility meter to remote receiver, said AMR system comprising:

a plurality of utility meters disposed throughout a predefined area, wherein each utility meter is configured with a transmitter module comprising (i) a power source configured for supplying power to at least said transmitter module and (ii) a processing device electrically associated with at least one of one of integral and external memory, wherein said processing device is further electrically associated with communication circuitry comprising a programmable transmitter electrically associate with an antenna;

at least one airborne remote receiver configured to maneuver within said predefined area to position said remote receiver within communication range with each of said plurality of utility meters;

wherein said remote receiver and each of said plurality of utility meters track the passage of time and wherein the time data for each of said plurality of utility meters is synchronized with the remote receiver time data; and wherein said processing device is configured to transmit a meter-data-signal according to a predefined meter-schedule.

12. An AMR system as in claim 11, wherein at least one of said transmitter modules defines a universal meter transmitter (UMT), said power source is a battery and said airborne remote receiver comprises a drone.

13. An AMR system as in claim 12, wherein said UMT is configured to operate in any one of a plurality of modes without hardware modification including at least one of a drive-by mode, a fixed network mode and a fly-by mode.

14. An AMR system as in claim 13, wherein said UMT can transmit said meter-data-signal at a plurality of power levels and where the said meter-data-signal includes transmitter power level data relatable to the power level at which the UMT transmitted said meter-data-signal.

15. An AMR system as in claim 14, wherein said remote receiver uses said power level data to automatically modify the remote receiver's flight path through said predefined area to lower the UMT transmitter power level required for said UMT to communicate with said remote receiver.

16. An AMR system as in claim 11, further comprising a plurality of airborne remote receivers and wherein said predefined meter-schedule defines a real-time-data transmit window value and wherein each of said plurality of utility meters are configured to transmit said module-data-signal at least once during said real-time-data transmit window and wherein said plurality of airborne remote receivers are distributed throughout said predefined area to collectively collect real-time-data from a predefined percentage of said plurality of utility meters.

17. An AMR system as in claim 16, wherein at least one of said plurality of airborne remote receivers is deployed in a drone tower mode.

18. A universal meter interface unit (UMIU) configured for transmitting utility data, said meter interface unit comprising:

a UMIU housing suitably configured for housing UMIU components;

a controller electrically associated with a memory and disposed inside said UMIU housing wherein said controller is further electrically associated with programmable communication circuitry comprising a transceiver that is electrically associate with an antenna that is one of (a) disposed at least partially inside said UMIU housing and (b) external to said UMIU housing;

a register interface configured for being electrically associated with a utility meter via at least one of (a) a wired interface and (b) a wireless interface and wherein said register interface is further electrically associated with said controller and wherein said controller is configured to use said register interface to retrieve utility-data from said utility meter according to a predefined schedule;

a power pack that is one of (a) disposed inside said UMIU housing and (b) disposed within a power pack housing configured for being removably mechanically associated with said UMIU housing wherein said power pack is suitably configured for supplying power to said UMIU components including at least two of said controller, said transceiver and said register interface;

wherein said controller is configured to execute any one of a plurality of UMIU modes without hardware modification and according to a UMIU mode schedule and wherein said UMIU mode schedule comprise at least one of (a) a UMIU mode configured for drive-by interrogations, (b) a UMIU mode configured for fixed network interrogations, and (c) a UMIU mode configured for fly-by interrogations; and wherein said controller is further configured to program said communications circuitry to transmit a meter-data-signal at any one of a plurality of power levels and wherein said meter-data-signal comprises at least part of said utility-data.

19. A UMIU configured for transmitting utility data as in claim 18, wherein said utility-data includes the power level at which the communication circuitry transmitted said meter-data-signal.

20. A UMIU configured for transmitting utility data as in claim 19, wherein said controller increases the power level at which the communication circuitry transmits said meter-data-signal until one of (a) a data received message is received from a remote device and (b) a predefined amount of time passes without receiving a data received message from a remote device.

* * * * *